United States Patent
Jeon et al.

(10) Patent No.: US 9,691,944 B2
(45) Date of Patent: Jun. 27, 2017

(54) SEMICONDUCTOR LIGHT-EMITTING DEVICE AND METHOD FOR MANUFACTURING THE SAME

(71) Applicant: SEMICON LIGHT CO., LTD., Gyeonggi-do (KR)

(72) Inventors: Soo Kun Jeon, Gyeonggi-do (KR); Eun Hyun Park, Gyeonggi-do (KR)

(73) Assignee: SEMICON LIGHT CO., LTD., Gyeonggi-Do (KR)

( * ) Notice: Subject to any disclaimer, the term of this patent is extended or adjusted under 35 U.S.C. 154(b) by 35 days.

(21) Appl. No.: 14/651,818

(22) PCT Filed: Dec. 4, 2013

(86) PCT No.: PCT/KR2013/011173
§ 371 (c)(1),
(2) Date: Dec. 30, 2015

(87) PCT Pub. No.: WO2014/088322
PCT Pub. Date: Jun. 12, 2014

(65) Prior Publication Data
US 2016/0126422 A1    May 5, 2016

(30) Foreign Application Priority Data

Dec. 4, 2012   (KR) .................. 10-2012-0139553
Jan. 10, 2013  (KR) .................. 10-2013-0002951
Jan. 10, 2013  (KR) .................. 10-2013-0002952

(51) Int. Cl.
*H01L 33/00*   (2010.01)
*H01L 33/46*   (2010.01)
(Continued)

(52) U.S. Cl.
CPC .............. *H01L 33/46* (2013.01); *H01L 33/20* (2013.01); *H01L 33/24* (2013.01); *H01L 33/38* (2013.01);
(Continued)

(58) Field of Classification Search
CPC ......... H01L 33/20; H01L 33/24; H01L 33/38; H01L 33/46; H01L 33/00; H01L 33/025;
(Continued)

(56) References Cited

U.S. PATENT DOCUMENTS 6,650,044 B1   11/2003   Lowery ................... 313/502
7,939,841 B2   5/2011    Lee et al. ................ 257/98
(Continued)

FOREIGN PATENT DOCUMENTS

| JP | 2006-005215 | 1/2006 | ............ H01L 33/00 |
| JP | 2009-164423 | 7/2009 | ............ H01L 33/00 |

(Continued)

OTHER PUBLICATIONS

International Search Report (ISR) dated Mar. 13, 2014 in PCT/KR2013/011173 with English translation.

*Primary Examiner* — Teresa M Arroyo
(74) *Attorney, Agent, or Firm* — Harness, Dickey & Pierce, P.L.C.

(57) ABSTRACT

A semiconductor light-emitting device of the present disclosure includes a plurality of semiconductor layers; a first inclined face having a first slope inside the plurality of semiconductor layers, which connects an etched-exposed surface of the first semiconductor layer with the surface of the second semiconductor layer and reflects the light from the active layer towards the first semiconductor layer; a second inclined face having a second slope greater than the first slope, which is provided around the plurality of semiconductor layers and reflects the light from the active layer (Continued)

towards the first semiconductor layer; a non-conductive reflective film formed on the second semiconductor layer, for reflecting the light from the active layer towards the first semiconductor layer.

9 Claims, 27 Drawing Sheets

(51) Int. Cl.
*H01L 33/20* (2010.01)
*H01L 33/24* (2010.01)
*H01L 33/38* (2010.01)
*H01L 31/0248* (2006.01)
*H01L 51/50* (2006.01)
*H01L 33/02* (2010.01)
*H01L 33/08* (2010.01)
*H01L 31/0352* (2006.01)

(52) U.S. Cl.
CPC ...... *H01L 31/0248* (2013.01); *H01L 31/0352* (2013.01); *H01L 33/025* (2013.01); *H01L 33/08* (2013.01); *H01L 51/50* (2013.01)

(58) Field of Classification Search
CPC ......... H01L 33/08; H01L 51/00; H01L 51/50; H01L 31/0248; H01L 31/0352
USPC .......................................................... 257/98
See application file for complete search history.

(56) References Cited

U.S. PATENT DOCUMENTS

| | | | | |
|---|---|---|---|---|
| 2010/0210046 A1* | 8/2010 | Kao | ...................... | H01L 33/385 438/26 |
| 2011/0186889 A1* | 8/2011 | Kang | .................... | H01L 33/007 257/98 |
| 2011/0254036 A1* | 10/2011 | Kim | ........................ | H01L 33/20 257/98 |
| 2012/0299038 A1* | 11/2012 | Hwang | ................. | H01L 33/385 257/98 |
| 2014/0070254 A1* | 3/2014 | Akagi | ..................... | H01L 33/58 257/98 |
| 2014/0124807 A1* | 5/2014 | Kuo | ....................... | H01L 33/405 257/98 |
| 2015/0359056 A1* | 12/2015 | Song | .................. | H05B 33/0827 315/186 |
| 2016/0064611 A1* | 3/2016 | Choi | ..................... | H01L 33/382 257/98 |
| 2016/0133788 A1* | 5/2016 | Kim | ........................ | H01L 33/20 257/98 |
| 2016/0260869 A1* | 9/2016 | Jeon | ....................... | H01L 33/38 |

FOREIGN PATENT DOCUMENTS

| | | | |
|---|---|---|---|
| JP | 2009-164506 | 7/2009 | ............. H01L 33/00 |
| KR | 10-2005-0066358 | 6/2005 | ............. H01L 33/46 |
| KR | 10-2006-0077801 | 7/2006 | ............. H01L 33/20 |

\* cited by examiner

SEMICONDUCTOR LIGHT-EMITTING DEVICE AND METHOD FOR MANUFACTURING THE SAME

CROSS-REFERENCE TO RELATED APPLICATIONS

This application is a national phase application of PCT Application No. PCT/KR2013/011173, filed on Dec. 4, 2013, which claims the benefit of Korean Patent Application 10-2013-0002952 filed on Jan. 10, 2013, Korean Patent Application 10-2013-0002951 also filed on Jan. 10, 2013 and Korean Patent Application No. 10-2012-0139553 filed on Dec. 4, 2012. The entire disclosure of the application identified in this paragraph is incorporated herein by reference.

FIELD

The present disclosure relates generally to a semiconductor light-emitting device and a method of manufacturing the semiconductor light-emitting device. In particular, the present invention relates to a semiconductor light-emitting device having a light reflecting face and a method of manufacturing the semiconductor light-emitting device.

Within the context herein, the term "semiconductor light-emitting device" refers to a semiconductor optical device which generates light by recombination of electrons and holes, and one example thereof includes a group III-nitride semiconductor light-emitting device. The group III-nitride semiconductor is composed of a compound of formula $Al_{(x)}Ga_{(y)}In_{(1-x-y)}N$ (wherein, $0 \leq x \leq 1$, $0 \leq y \leq 1$, $0 \leq x+y \leq 1$). Another example thereof includes a GaAs-based semiconductor light-emitting device used for red light emission.

BACKGROUND

This section provides background information related to the present disclosure which is not necessarily prior art.

FIG. 1 is a view illustrating an example of the semiconductor light-emitting device (Lateral Chip) in the prior art, in which the semiconductor light-emitting device includes a substrate 100, and a buffer layer 200, a first semiconductor layer 300 having a first conductivity, an active layer 400 for generating light via electron-hole recombination and a second semiconductor layer 500 having a second conductivity different from the first conductivity, which are deposited over the substrate 100 in the order mentioned, and additionally, a light-transmitting conductive film 600 for current spreading, and an electrode 700 serving as a bonding pad are formed thereon, and an electrode 800 serving as a bonding pad is formed on an etched-exposed portion of the first semiconductor layer 300.

FIG. 2 is a view illustrating another example of the semiconductor light-emitting device (Flip Chip) in the prior art, in which the semiconductor light-emitting device includes a substrate 100, and a first semiconductor layer 300 having a first conductivity, an active layer 400 for generating light via electron-hole recombination and a second semiconductor layer 500 having a second conductivity different from the first conductivity, which are deposited over the substrate 100 in the order mentioned, and additionally, three-layered electrode films for reflecting light towards the substrate 100, i.e., an electrode film 901, an electrode film 902 and an electrode film 903 are formed thereon, and an electrode 800 serving as a bonding pad is formed on an etched-exposed portion of the first semiconductor layer 300.

FIG. 3 is a view illustrating still another example of the semiconductor light-emitting device (Vertical Chip) in the prior art, in which the semiconductor light-emitting device includes a first semiconductor layer 300 having a first conductivity, an active layer 400 for generating light via electron-hole recombination and a second semiconductor layer 500 having a second conductivity different from the first conductivity, which are deposited in the order mentioned, and additionally, a metallic reflective film 910 for reflecting light towards the first semiconductor layer 300 is formed on the second semiconductor layer 500, and an electrode 940 is formed on the side of a supporting substrate 930. The metallic reflective film 910 and the supporting substrate 930 are coupled together by a wafer bonding layer 920. An electrode 800 serving as a bonding pad is formed on the first semiconductor layer 300.

FIG. 4 is a view illustrating an example of the semiconductor light-emitting device described in U.S. Pat. No. 6,650,044, in which the semiconductor light-emitting device is of a flip chip type comprising a substrate 100, a first semiconductor layer 300 having a first conductivity, an active layer 400 for generating light via electron-hole recombination and a second semiconductor layer 500 having a second conductivity different from the first conductivity, which are deposited over the substrate 100 in the order mentioned, and additionally, a reflective film 950 for reflecting light towards the substrate 100 is formed on the second semiconductor layer 500, an electrode 800 serving as a bonding pad is formed on an etched-exposed portion of the first semiconductor layer 300, and an encapsulant 1000 adapted to enclose the substrate 100 and the semiconductor layers 300, 400 and 500. While the reflective film 950 can be composed of a metal layer as in FIG. 2, it can also be composed of an insulating reflective film, such as $SiO_2/TiO_2$ DBR (Distributed Bragg Reflector), as shown in FIG. 5. The semiconductor light-emitting device is mounted on a PCB (Printed Circuit Board) 1200 equipped with wiring 820, 960, by means of a conductive adhesive 830, 970. The encapsulant 1000 usually contains phosphor. As the semiconductor light-emitting device herein includes the encapsulant 1000, the other part of the semiconductor light-emitting device free of the encapsulant 1000 will be referred to as a semiconductor light-emitting device chip, for distinction.

FIG. 5 is a view illustrating yet another example of the semiconductor light-emitting device the prior art, in which the semiconductor light-emitting device includes a substrate 100, a buffer layer 200 growing on the substrate 100, an n-type semiconductor layer 300 growing on the buffer layer 200, an active layer 400 growing on the n-type semiconductor layer 300, a p-type semiconductor layer 500 growing on the active layer 400, a transparent conductive film 600 formed on the p-type semiconductor layer 500 for current-spreading, a p-side bonding pad 700 formed on the transparent conductive film 600, and an n-side bonding pad 800 formed on an etched-exposed portion of the n-type semiconductor layer 300. Moreover, a DBR 900 and a metallic reflective film 904 are formed on the transparent conductive film 600.

FIG. 13 is a view illustrating an example of the semiconductor light-emitting device proposed in JPA 2009-164423. In the semiconductor light-emitting device, a DBR 900 and a metallic reflective film 904 are provided on a plurality of semiconductor layers 300, 400 and 500, a phosphor 1000 is disposed opposite thereto. The metallic reflective film 904 and an n-side bonding pad 800 are electrically connected to external electrodes 1100 and 1200. The external electrodes 1100 and 1200 can be lead frames for a package, or electrical patterns provided on the COB (Chip on Board) or PCB (Printed Circuit Board). The phosphor 1000 can be coated conformally, or can be mixed with an epoxy resin and then used to cover the external electrodes 1100 and 1200. The phosphor 1000 absorbs light that is generated in the active layer, and converts this light to a light of longer or shorter wavelength.

DISCLOSURE

Technical Problem

The problems to be solved by the present disclosure will be described in the latter part of the best mode for carrying out the invention.

Technical Solution

This section provides a general summary of the disclosure and is not a comprehensive disclosure of its full scope or all of its features.

According to an aspect of the present disclosure, there is provided a semiconductor light-emitting device, comprising a plurality of semiconductor layers including a first semiconductor layer having a first conductivity; a second semiconductor layer having a second conductivity different from the first conductivity, and an active layer which is interposed between the first semiconductor layer and the second semiconductor layer and generates light by recombination of electrons and holes; a first inclined face having a first slope inside the plurality of semiconductor layers, which connects an etched-exposed surface of the first semiconductor layer with the surface of the second semiconductor layer and reflects the light from the active layer towards the first semiconductor layer; a second inclined face having a second slope greater than the first slope, which is provided around the plurality of semiconductor layers and reflects the light from the active layer towards the first semiconductor layer; a non-conductive reflective film formed over the second semiconductor layer, for reflecting the light from the active layer towards the first semiconductor layer; a first electrode which provides either electrons or holes to the plurality of semiconductor layers and is electrically connected to the etched-exposed surface of the first semiconductor layer; and a second electrode disposed on the non-conductive reflective film, which provides either electrons if the holes are provided by the first electrode or holes if the electrons are provided by the first electrode and is electrically connected to the second semiconductor layer.

According to another aspect of the present disclosure, there is provided a method of manufacturing a semiconductor light-emitting device, comprising: a step of preparing a plurality of semiconductor layers by using a growth substrate, the plurality of semiconductor layers including a first semiconductor layer having a first conductivity, a second semiconductor layer having a second conductivity different from the first conductivity, and an active layer which is interposed between the first semiconductor layer and the second semiconductor layer and generates light by recombination of electrons and holes; a first etching step for forming a first inclined face having a first slope within the plurality of semiconductor layers by exposing the surface of the first semiconductor layer using a first mask, the first inclined face connecting the exposed surface of the first semiconductor layer with the surface of the second semiconductor layer and reflecting the light from the active layer towards the first semiconductor layer; a second etching step for forming a second inclined face having a second slope greater than the first slope around the plurality of semiconductor layers using a second mask of a different material from that of the first mask, the second inclined face reflecting the light from the active layer towards the first semiconductor layer; and a step of forming a non-conductive reflective film on the second semiconductor layer for reflecting the light from the active layer towards the first semiconductor layer on the side of the growth substrate.

Advantageous Effects

The advantageous effects of the present disclosure will be described in the latter part of the best mode for carrying out the invention.

BEST MODE FOR CARRYING OUT INVENTION

Hereinafter, the present disclosure will now be described in detail with reference to the accompanying drawings.

Figure 6:
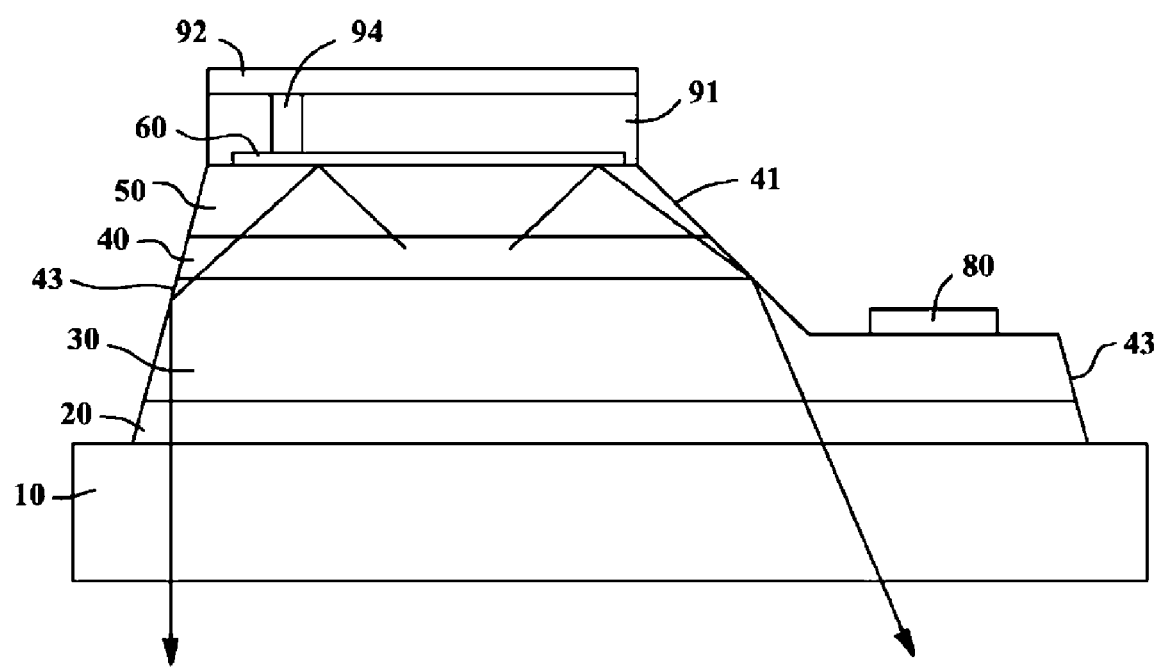
FIG. 6 is a view illustrating an example of the semiconductor light-emitting device according to the present disclosure.

FIG. 6 is a view illustrating an example of the semiconductor light-emitting device according to the present disclosure, in which the semiconductor light-emitting device according to the present disclosure includes a substrate 10, a buffer layer 20 growing on the substrate 10, an n-type semiconductor layer 30 growing on the buffer layer 20, an active layer 40 growing on the n-type semiconductor layer 30 and generating light by recombination of electrons and holes, and a p-type semiconductor layer 50 growing on the active layer 40.

The substrate 10, which can eventually be removed, is mainly made of sapphire, SiC, Si, GaN or the like, and the buffer layer 20 can be omitted. When the substrate 10 is removed or has conductive properties, an electrode 80 may be formed on the n-type substrate 30 after the substrate 10 is removed therefrom, or on the conductive substrate 10 side. The n-type semiconductor layer 30 and the p-type semiconductor layer 50 can switch their positions with each other. For a group III nitride semiconductor light-emitting device, those semiconductor layers are mainly made of GaN. Each of the semiconductor layers 20, 30, 40 and 50 can be configured in a multilayer, and may also have an additional layer.

Figure 5:
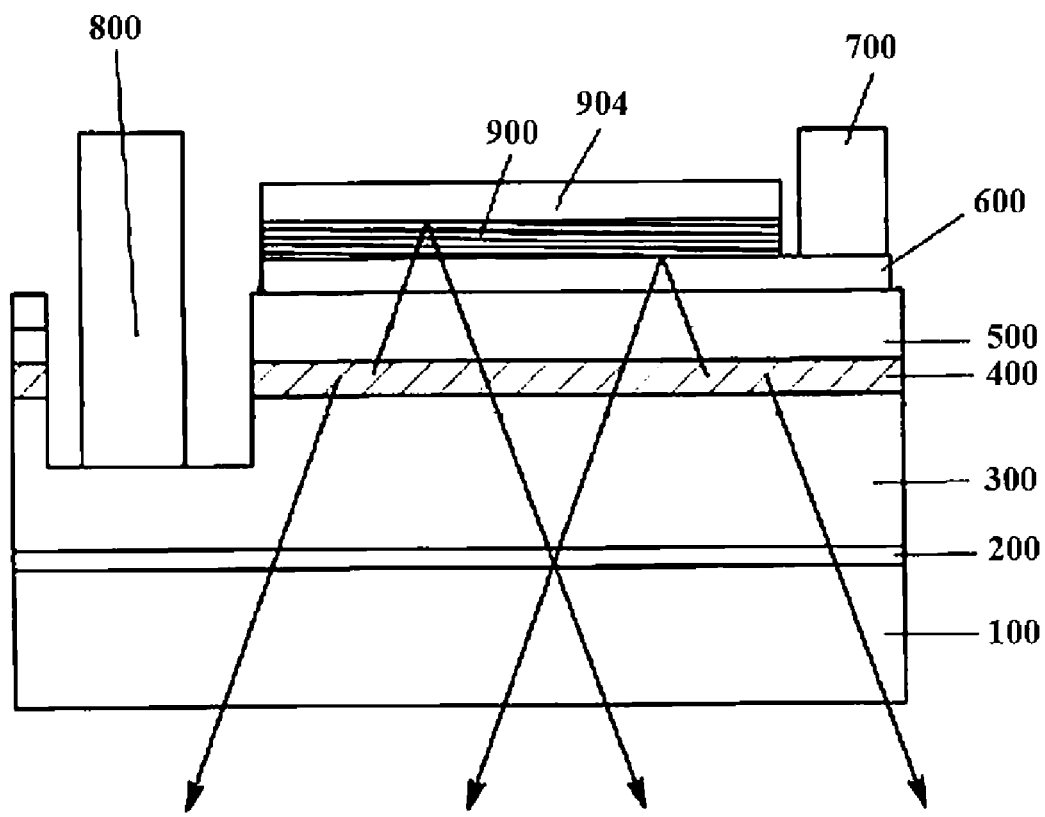
FIG. 5 is a view illustrating yet another example of the semiconductor light-emitting device in the prior art.

Moreover, an electrode 80 for supplying electrons to the n-type semiconductor layer 30, and an electrode 92 for supplying holes to the p-type semiconductor layer 50 are provided. The electrode 80 may have a special bump that makes the electrode 80 sufficiently high enough to be coupled with a package, or the electrode 80 per se may be deposited up to a height where it can be coupled with a package as shown in FIG. 5.

A gently inclined face 41 connecting an etched-exposed surface of the n-type semiconductor layer 30 with the surface of the p-type semiconductor layer 50 is formed in the plurality of semiconductor layers 30, 40 and 50, and a steeply inclined face 43 having a greater slope than that of the gently inclined face 41 is formed around the plurality of semiconductor layers 30, 40 and 50. The gently inclined face 41 can have a relatively gentle slope of approximately 45° for example, and the steeply inclined face 43 can have a sharp slope of approximately 75° for example. Even though both the gently inclined face 41 and the steeply inclined face 43 reflect the light from the active layer 40 towards the n-type semiconductor layer 30, the steeply inclined face 43 reflects the light from the active layer 40 towards the n-type semiconductor layer 30, i.e. towards the substrate 10, at a higher efficiency than the gently inclined face 41. If the gently inclined face 41 is formed across a broader area, it means that less light is reflected towards the n-type semiconductor layer 30 and it also means that a light-emissive area becomes decreased. Therefore, it is not desirable to form the gently inclined face 41 in place of the steeply inclined face 43 around the plurality of semiconductor layers 30, 40 and 50, that is, in edge areas of the p-type semiconductor layer 50.

A non-conductive reflective film 91 is formed over the p-type semiconductor layer 50 in order to reflect the light from the active layer 40 towards the substrate 10 used for growing, or towards the n-type semiconductor layer 30 in case the substrate 10 has been removed. The non-conductive reflective film 91 may be formed over the p-type semiconductor layer 50 alone, or it can be further formed over an etched-exposed n-type semiconductor layer 30, over the first inclined face 41 or over part of the electrode 80. Furthermore, it can also be formed such that it covers the second inclined face 43 around the plurality of semiconductor layers. A person skilled in the art should understand that it is not absolutely necessary for the non-conductive reflective film 91 to cover all areas on the semiconductor layers 30 and 50 opposite the substrate 10. When the non-conductive reflective film 91 covers all areas, the reflection efficiency by the non-conductive reflective film 91 can be maximized. Meanwhile, an increase in the reflection efficiency, which can be obtained by forming the non-conductive reflective film 92 on surfaces such as the first inclined face 41 and the second inclined face 43 has insignificant effects, but it rather contributes to an increase in manufacturing costs. Also, it can be effective that the non-conductive reflective film 91 is formed only over the p-type semiconductor layer 50 because it is hard to form the non-conductive reflective film 91 on an inclined surface, particularly a steeper surface. This non-conductive reflective film 91 serves as a reflective film, and it is preferably composed of light-transmitting materials for avoiding light absorption, for example, light-transmitting dielectric materials such as $SiO_x$, $TiO_x$, $Ta_2O_5$, $MgF_2$. When the non-conductive reflective film is composed of $SiO_x$, it has a refractive index lower than that of the p-type semiconductor layer 50 (e.g., GaN) such that it can reflect part of the light having an incidence angle greater than a critical angle, towards the semiconductor layers 30, 40 and 50. When the non-conductive reflective film 91 is composed of a DBR (e.g., DBR composed of a combination of $SiO_2$ and $TiO_2$), it can reflect a greater amount of light towards the semiconductor layers 30, 40 and 50. With the first and second inclined faces 41 and 43 having different tilt angles, various reflective faces can be provided in a semiconductor light-emitting device, which in turn would increase the efficiency of light extraction of the semiconductor light-emitting device. Moreover, with the first inclined face 41 being more gently sloped than the second inclined face, when the non-conductive reflective film 91 is to be formed on the first inclined face 41 (e.g. for the purpose of passivation, insulation and so on), the non-conductive reflective film 91 can be formed in a stable manner.

Figure 7:
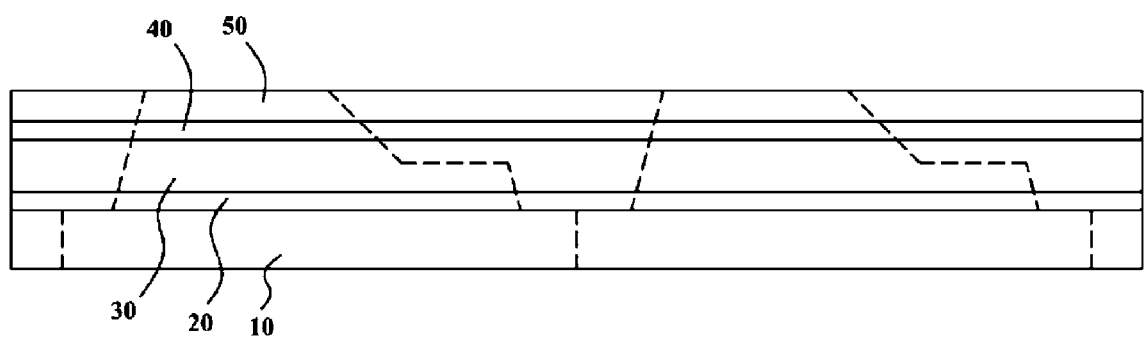
FIG. 7 to FIG. 9 are views illustrating an example of a method of manufacturing the semiconductor light-emitting device according to the present disclosure.
Figure 8:
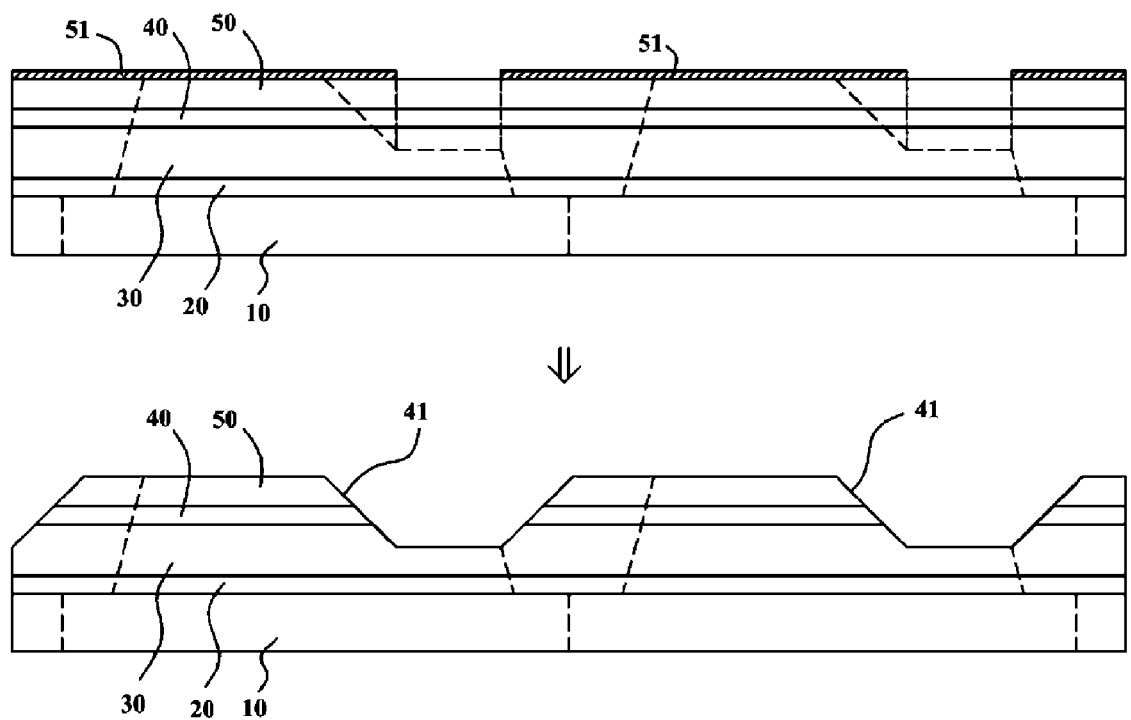
Figure 9:
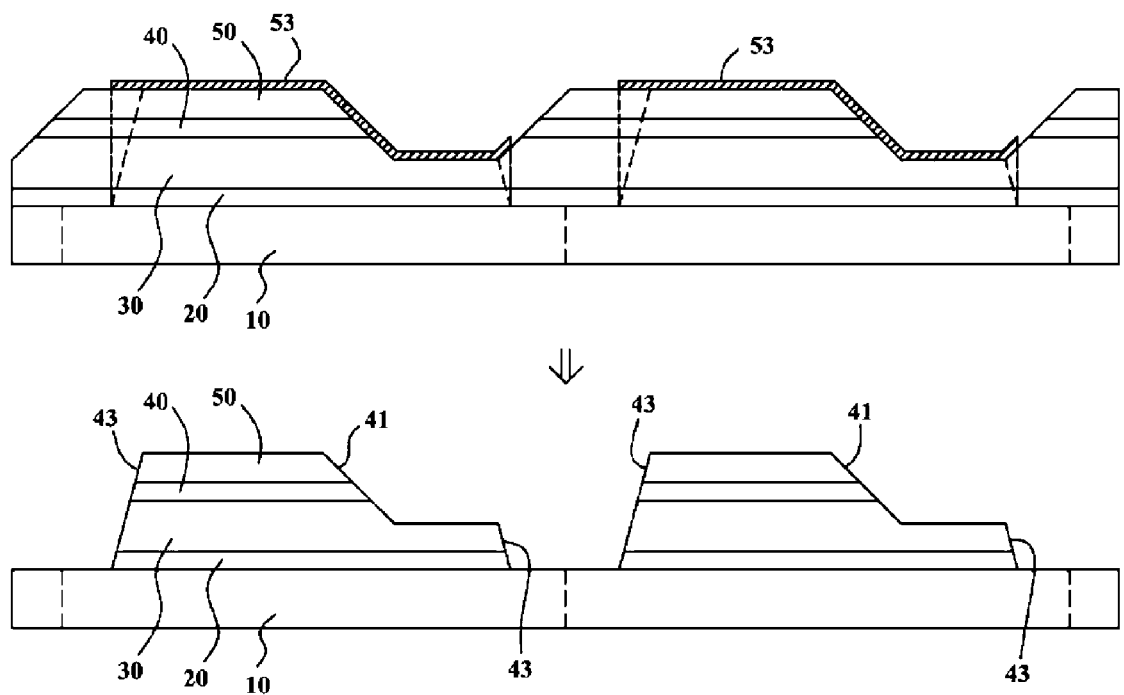

FIG. 7 to FIG. 9 are views illustrating an example of a method of manufacturing the semiconductor light-emitting device according to the present disclosure, in particular, a process of forming the gently inclined face 41 and the steeply inclined face 43.

First, referring to FIG. 7, a plurality of semiconductor layers, including an n-type semiconductor layer 30, a p-type semiconductor layer 50 and an active layer 40 which is interposed between the n-type semiconductor layer 30 and the p-type semiconductor layer 50 and generates light by recombination of electrons and holes, and having been grown using a substrate 10, is prepared in a wafer form.

Next, an etching process is carried out to expose part of the n-type semiconductor layer 30. In particular, referring to FIG. 8, a mask 51 is applied to all areas on the p-type semiconductor layer 50 except an area corresponding to a portion of the n-type semiconductor layer 30 to be exposed, and then the etching process is carried out. Dry etching such as ICP (Inductively Coupled Plasma) can be used. The mask 51 is made of materials susceptible to etching, for instance, photo-resistors having a relatively low etching resistance. As a result of this process, a gently inclined face 41 is formed.

Next, an etching process is carried out to isolate the integrated wafer of a plurality of semiconductor light-emitting devices into many semiconductor light-emitting devices. In particular, referring to FIG. 9, a mask 53 is applied to an area including an already exposed surface of the n-type semiconductor layer 30 which will constitute the top face of a semiconductor light-emitting device together with the surface of the p-type semiconductor layer 50, and then an etching process is carried out. Again, dry etching such as ICP (Inductively Coupled Plasma) dry etching can be used. This mask 53 is made of materials having a greater etching resistance than that of the mask 51 used in the etching process described above. For instance, $SiO_2$ having a greater etching resistance than that of photo-resistor may be used. As a result of this process, a steeply inclined face 43 is formed. In these etching processes for isolation, the substrate 10 can be cut and isolated to completely independent semiconductor light-emitting devices, or the substrate 10 may just be etched to a certain depth keeping the substrate in non-cut condition and distinctive from other neighboring semiconductor light-emitting devices. In the latter case, i.e. when the etching process is performed on the substrate to a depth where the substrate is kept in non-cut condition, other subsequent manufacturing processes may be preceded before cutting the substrate by laser scribing and isolating the substrate to completely independent semiconductor light-emitting devices.

Figure 10:
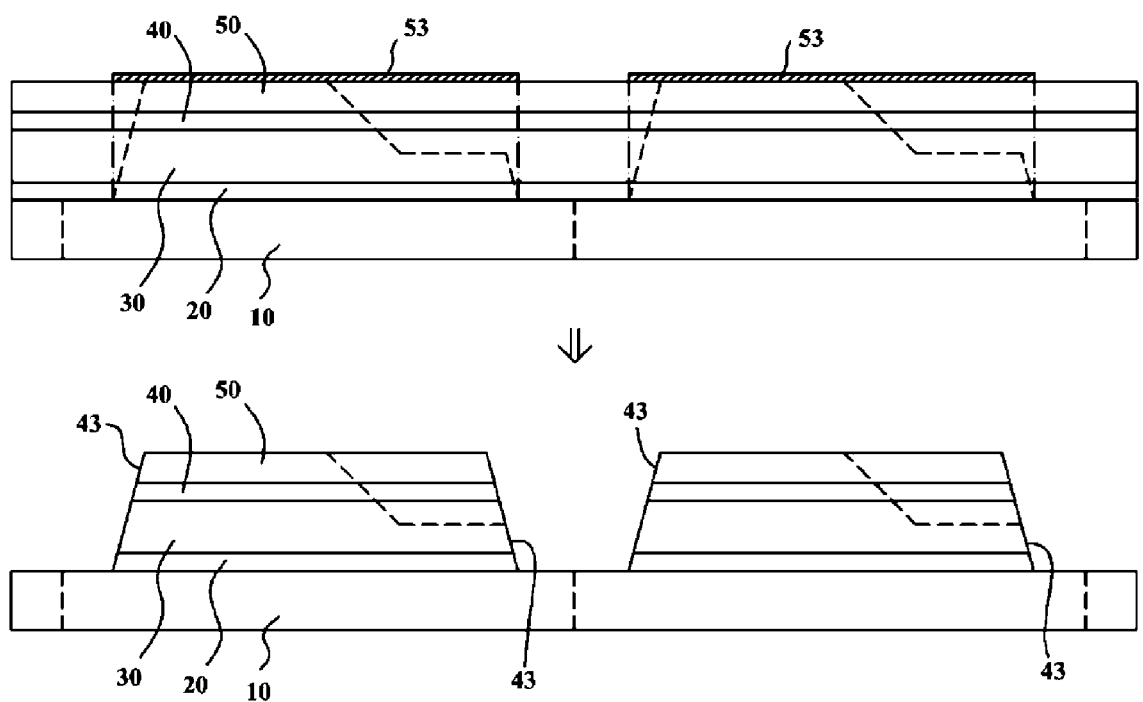
FIG. 10 and FIG. 11 are views illustrating another example of a method of manufacturing the semiconductor light-emitting device according to the present disclosure.
Figure 11:
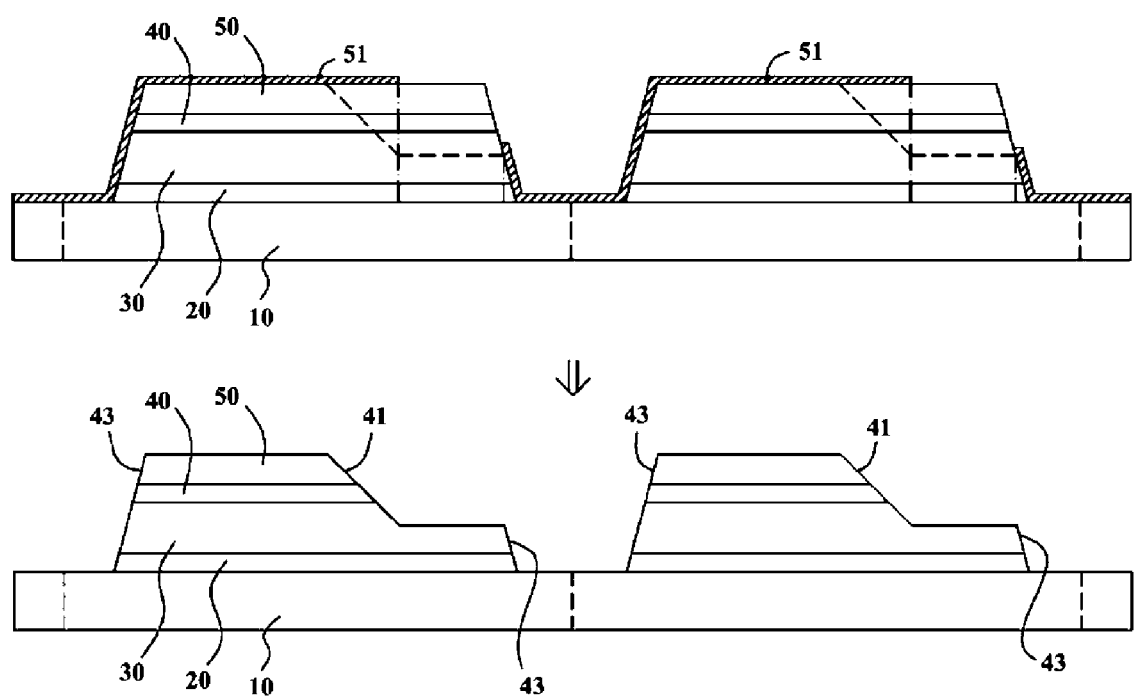

FIG. 10 and FIG. 11 are views illustrating another example of a method of manufacturing the semiconductor light-emitting device according to the present disclosure, in particular a case where the etching process for isolation in FIG. 9 is carried out, prior to the etching process for exposure in FIG. 8. In this example, two etching processes that use masks 51 and 53, respectively, having different etching resistances are carried out in different sequences, yet the semiconductor light-emitting device manufactured therefrom is same as others. Thus, any repetitive detailed description thereof will be omitted.

As mentioned above, once the gently inclined face 41 is formed within the plurality of semiconductor layers and the steeply inclined face 43 is formed around the plurality of semiconductor layers by two etching processes, subsequent manufacturing processes including the formation of a non-conductive reflective film 91 over a p-type semiconductor layer will be performed.

Figure 12:
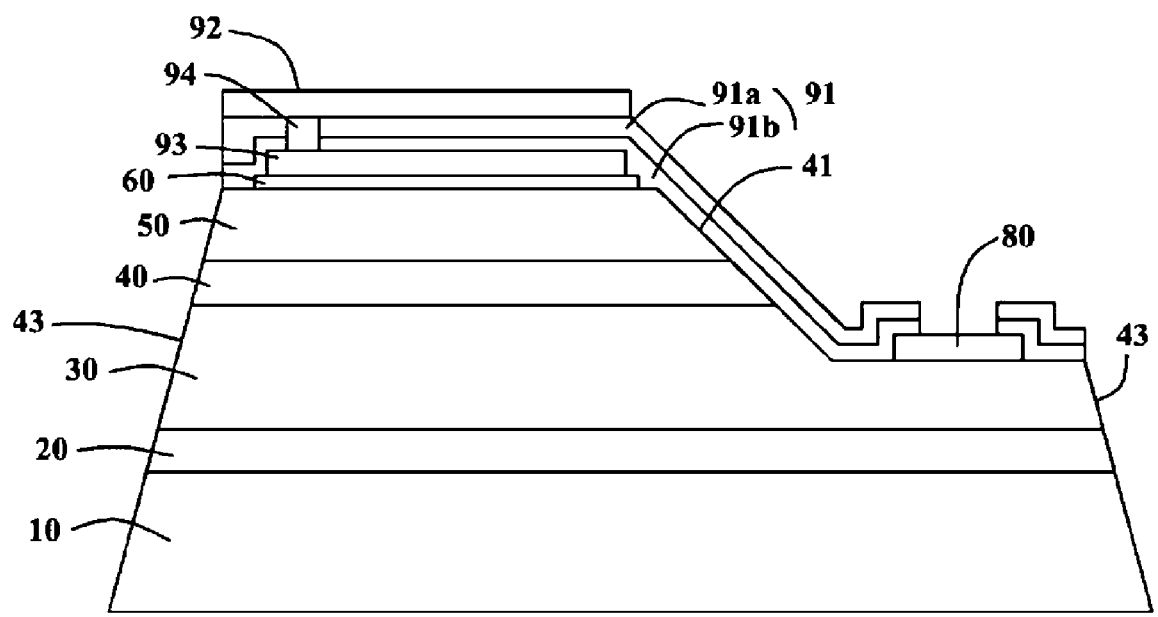
FIG. 12 is a view illustrating yet another example of the semiconductor light-emitting device according to the present disclosure.
Figure 13:
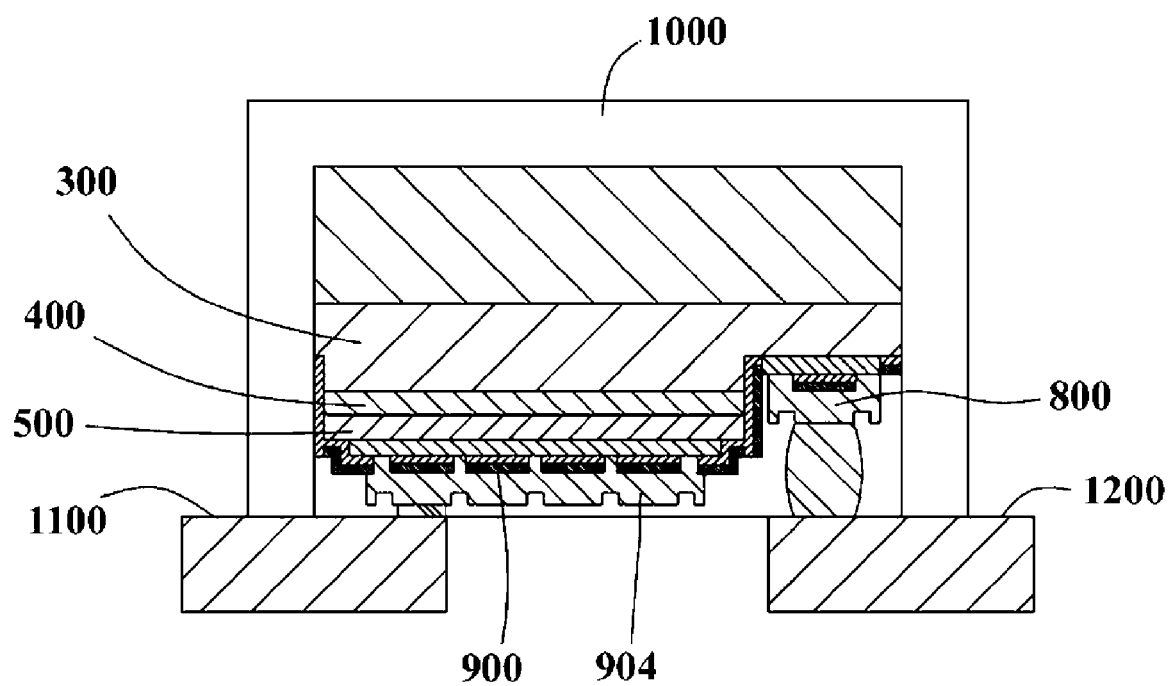
FIG. 13 is a view illustrating an example of the semiconductor light-emitting device proposed in JPA 2009-164423.

FIG. 12 is a view illustrating yet another example of the semiconductor light-emitting device according to the present disclosure, in which a non-conductive reflective film 91 has a duel structure of a DBR 91a and a dielectric film 91b having a lower refractive index than that of a p-type semiconductor layer 50. By forming the dielectric film 91b of a uniform thickness prior to the deposition of the DBR 91a demanding high precision, the DBR 91a can be prepared in a stable manner, which in turn is advantageous for light reflection. An example of suitable materials for the dielectric film 91b is $SiO_2$, and a proper thickness of the dielectric film ranges from 0.2 μm to 1.0 μm. When the DBR 91a is composed of $TiO_2/SiO_2$, each layer is designed to have an optical thickness of one-fourth of a given wavelength, and the number of its combinations is suitably between 4 and 20 pairs.

Figure 1:
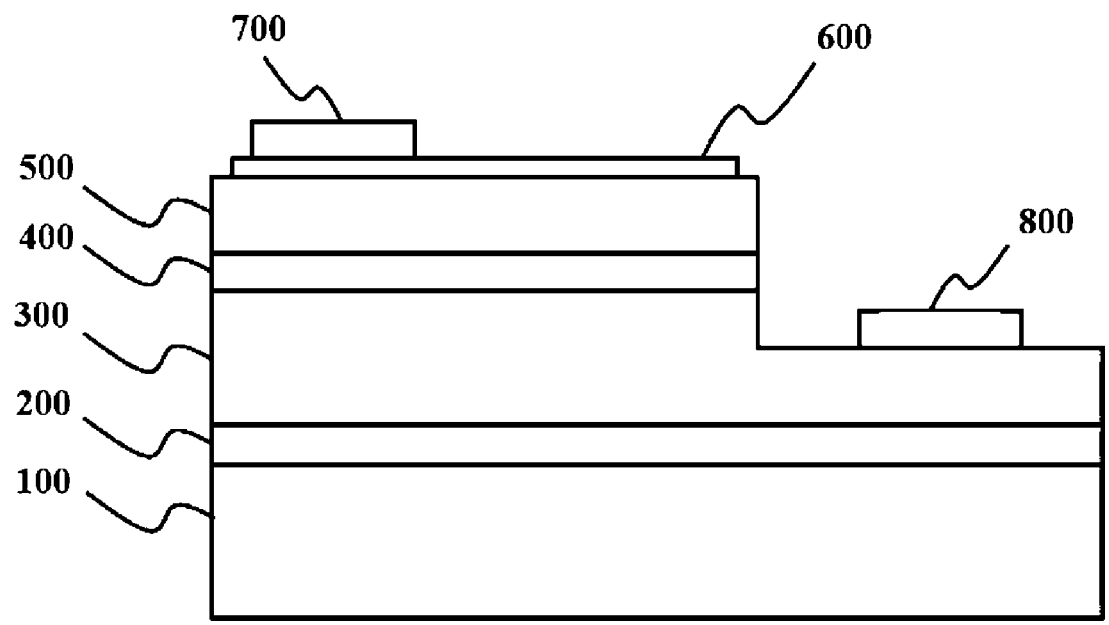
FIG. 1 is a view illustrating an example of the semiconductor light-emitting device (Lateral Chip) in the prior art.
Figure 2:
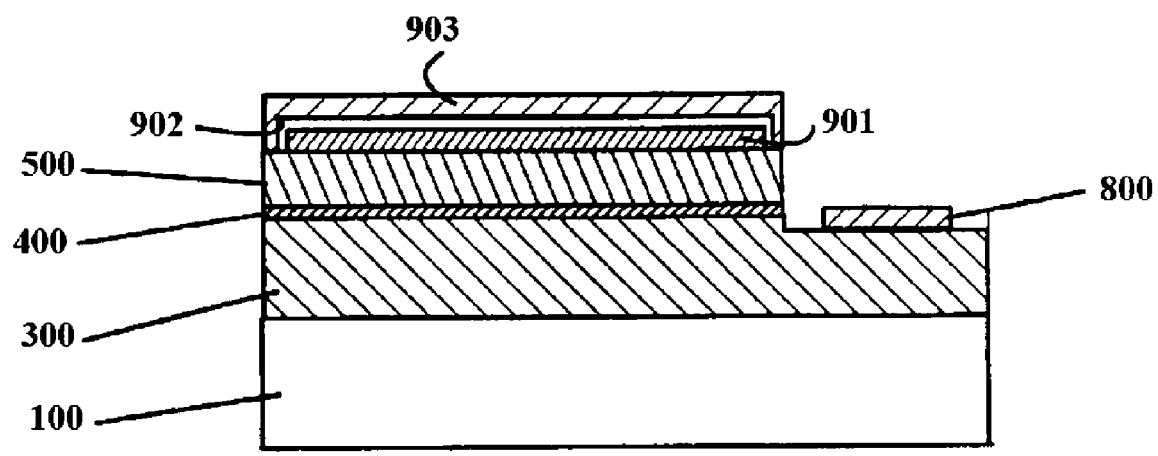
FIG. 2 is a view illustrating another example of the semiconductor light-emitting device (Flip Chip) in the prior art.
Figure 3:
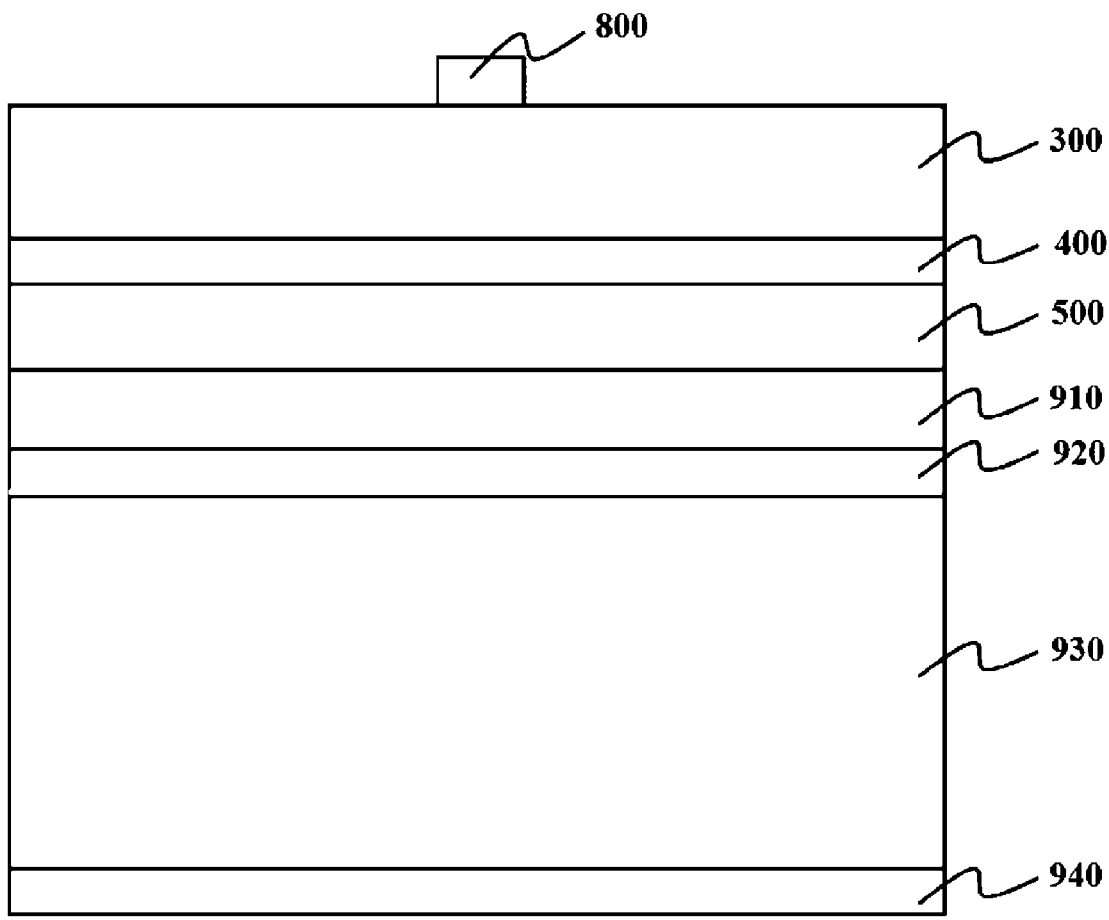
FIG. 3 is a view illustrating yet another example of the semiconductor light-emitting device (Vertical Chip) in the prior art.
Figure 4:
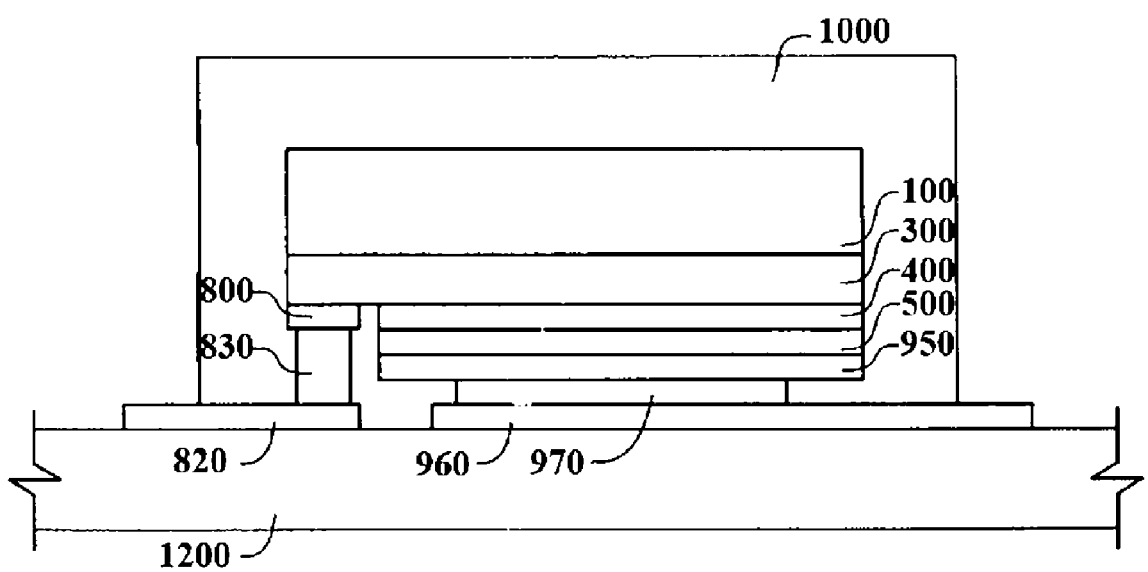
FIG. 4 is a view illustrating an example of the semiconductor light-emitting device described in U.S. Pat. No. 6,650,044.

Considering that the electrode 92 contributes to reflecting light from the active layer 30 towards the substrate 10 or towards the n-type semiconductor layer 30, the electrode 92 is preferably a conductive reflective film that covers all or almost all of the non-conductive reflective film 91, from above the p-type semiconductor layer 50. To this end, metals having a high reflectance, such as Al or Ag, may be utilized. A finger electrode 93 is also provided, extending between the non-conductive reflective film 91 and the p-type semiconductor layer 50, for supplying current (holes, to be precise) from the electrode 92 to the p-type semiconductor layer 50. The incorporation of the finger electrode 93 establishes a foundation for obtaining a flip-clip that has overcome all the problems imposed by the flip-chips in FIG. 2 and FIG. 5. Further, a suitable height for the finger electrode 93 ranges from 0.5 μm to 4.0 μm. If the finger electrode is too think, it can lead to an increased operating voltage; and if the finger electrode is too thick, it can affect the stability of the process and increase the material cost.

For electrical communication between the electrode 92 on the non-conductive reflective film 91, and the finger electrode 93, an electrical connection 94 passing through the non-conductive reflective film 91 is prepared in the vertical direction. Without the finger electrode 93, a number of electrical connections 94 will have to be connected directly to a light-transmitting conductive film 60 that is prepared on almost the entire face of the p-type semiconductor layer 50. In this case, however, it is not easy to form an acceptable electrical connection between the electrode 92 and the light-transmitting conductive film 60, and many problems can also be created during the manufacturing processes. In this regard, before the non-conductive reflective film 91 and the electrode 92 are formed, the finger electrode 93 is formed on the p-type semiconductor layer 50 or preferably on the light-transmitting conductive film 60 and then thermally treated, such that a stable electrical contact can be created between both. While Al or Ag having a high reflectance is a suitable material for the electrode 92, materials such as Cr, Ti, Ni or alloys thereof can also be suitable for the stable electrical contact. Accordingly, the incorporation of the finger electrode 93 makes it easier to meet the required design specifications. A person skilled in the art should understand that Al or Ag having a high reflectance can also be used for the finger electrode 93.

As described above, the light-transmitting conductive film 60 is preferably provided. It is very useful especially for a p-type GaN which demonstrates a poorer current spreading capability. Also, the p-type semiconductor layer 50 composed of GaN can benefit from the light-transmitting conductive film 60 to a great deal. For instance, materials such as ITO, Ni/Au or the like can be used for the light-transmitting conductive film 60. When the height of the finger electrode 93 reaches the electrode 92, the finger electrode 93 per se forms the electrical connection 94. Although it is possible to envisage configuring the electrode 92 in the same manner as a p-side bonding pad 700, it would not be desirable as the p-side bonding pad 700 absorbs light, and the area of the non-conductive reflective film 91 is reduced. Despite it being not desirable, a person skilled in the art would acknowledge that the electrode 92 can also be formed by a mounting face at the package level, following the fabrication of a chip. It should be noted that all of the components mentioned hitherto will suffice to form the semiconductor light-emitting device according to the disclosure.

Figure 14:
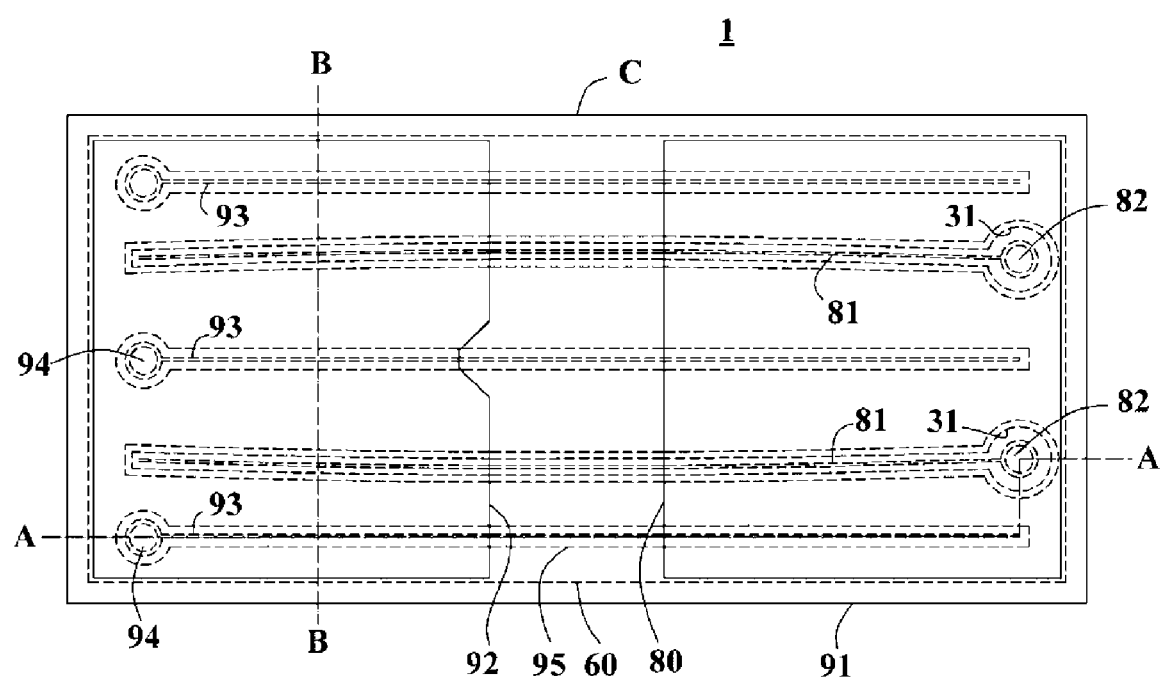
FIG. 14 is a view illustrating yet another example of the semiconductor light-emitting device according to the present disclosure.
Figure 15:
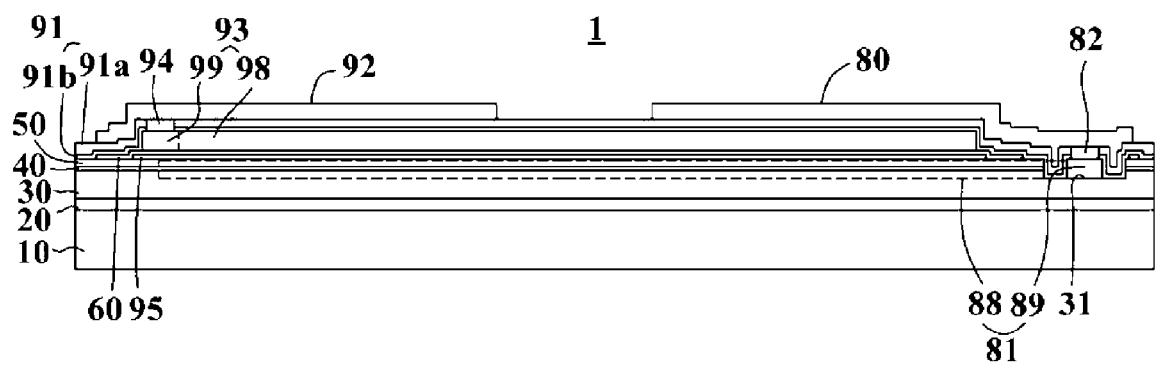
FIG. 15 is a cross-sectional view taken along line A-A in FIG. 14.
Figure 16:
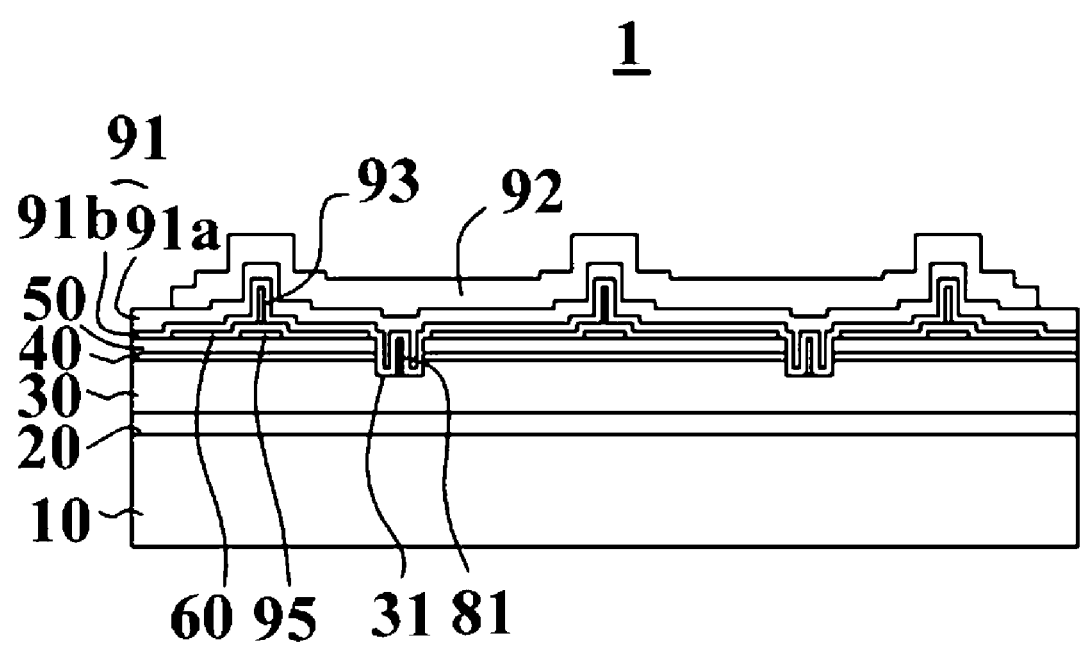
FIG. 16 is a cross-sectional view taken along line B-B in FIG. 14.
Figure 17:
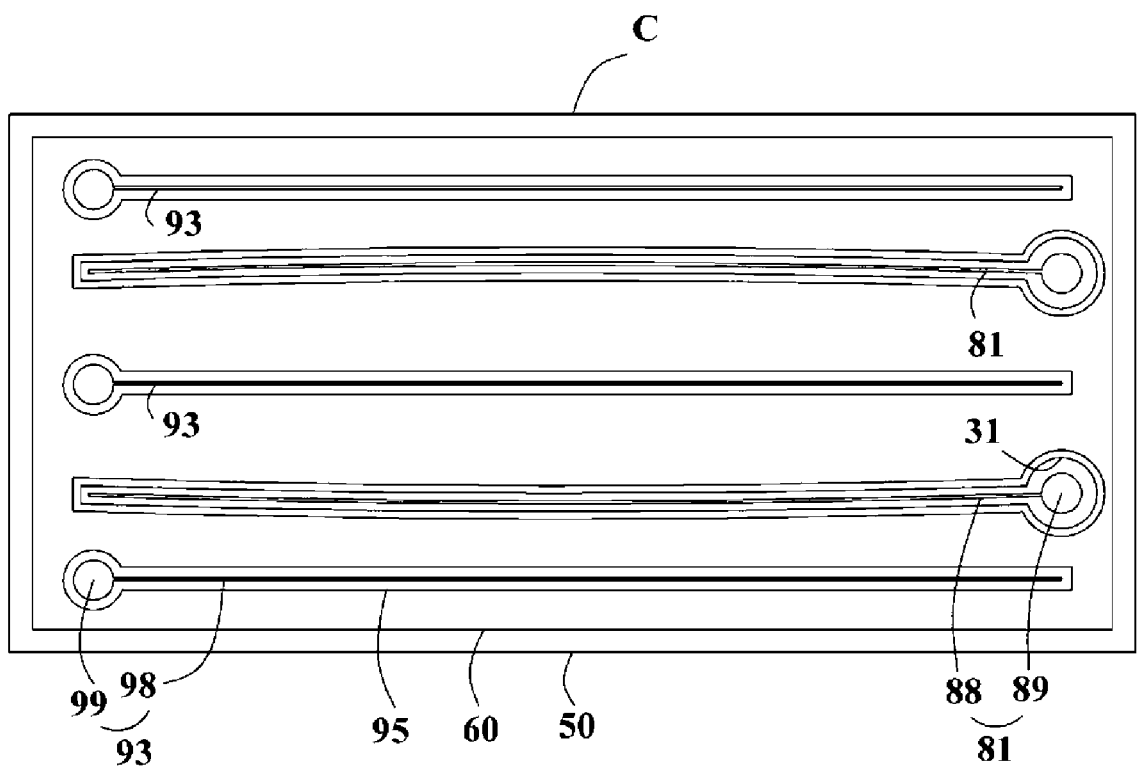
FIG. 17 is a view illustrating the semiconductor light-emitting device of FIG. 14 in a state where p-side and n-side electrodes and a non-conductive reflective film are removed.

FIG. 14 is a view illustrating yet another example of the semiconductor light-emitting device according to the present disclosure, FIG. 15 is a cross-sectional view taken along line A-A in FIG. 14, FIG. 16 is a cross-sectional view taken along line B-B in FIG. 14, and FIG. 17 is a view illustrating the semiconductor light-emitting device of FIG. 14 in a state where p-side and n-side electrodes and a non-conductive reflective film are removed.

The semiconductor light-emitting device 1 has a substrate 10, a buffer layer 20 growing on the substrate 10, an n-type semiconductor layer 30 growing on the buffer layer 20, an active layer 40 growing on the n-type semiconductor layer 30 and generating light by recombination of electrons and holes, and a p-type semiconductor layer 50 growing on the active layer 40.

The substrate 10, which can eventually be removed, is mainly made of sapphire, SiC, Si, GaN or the like, and the buffer layer 20 can be omitted. When the substrate 10 is removed or has conductive properties, an electrode 80 may be formed on the n-type substrate 30 after the substrate 10 is removed therefrom, or on the conductive substrate 10 side. The n-type semiconductor layer 30 and the p-type semiconductor layer 50 can switch their positions with each other. For a group III nitride semiconductor light-emitting device, those semiconductor layers are mainly made of GaN. Each of the semiconductor layers 20, 30, 40 and 50 can be configured in a multilayer, and may also have an additional layer.

Portions of the p-type semiconductor layer 50 and the active layer 40 are removed by a mesa etching process, and as a result thereof, two n-side contact areas exposing the n-type semiconductor layer 30 are formed and an n-side finger electrode 81 is formed on the n-type semiconductor layer 30 within each of the n-side contact areas 31. The n-side contact area 31 is extended in parallel with one lateral side C of the semiconductor light-emitting device. While the n-side contact areas 31 may be open towards a lateral direction of the semiconductor light-emitting device, they are preferably circumferentially surrounded and blocked by the active layer 40 and the p-type semiconductor layer 50, without being open towards any of the lateral directions. The number of the n-side contact areas 31 may be higher or lower, and the array configuration thereof can also vary. The n-side finger electrode 81 preferably includes a branch portion 88 extended lengthways, and a connecting portion 89 formed at one end of the branch portion 88 to have a greater width. As such, the n-side contact area 31 has a smaller width at the part where the branch portion 88 of the n-side finger electrode 81 is disposed and a greater width at the part where the connecting portion 89 of the n-side finger electrode 81 is disposed.

Three p-side finger electrodes 93 are formed on the p-type semiconductor layer 50. The p-side finger electrodes 93 are formed in parallel with the n-side finger electrodes 81, in which one of the p-side finger electrodes is arranged between two n-side finger electrodes 81 and the other two p-side finger electrodes are arranged on either side of the two n-side finger electrodes, respectively. Thus, the two n-side finger electrodes 81 and the three p-side finger electrodes 93 are positioned in an alternate manner. Also, the p-side finger electrode 93 preferably includes a branch portion 98 extended lengthways, and a connecting portion 99 formed at one end of the branch portion 98 to have a greater width. Meanwhile, as shown in FIG. 14, the connecting portion 99 of the p-side finger electrode 93 is placed on the opposite side of the connecting portion 89 of the n-side finger electrode 81, when the semiconductor light-emitting device is seen from the top. That is to say, the connecting portion 99 of the p-side finger electrode 93 is placed on the left side, while the connecting portion 89 of the n-side finger electrode 81 is placed on the right side. The p-side finger electrode 93 extends along the direction of one lateral side C of the semiconductor light-emitting device. For instance, in FIG. 14 and FIG. 17, it extends from the left side to the right side. These plural p-side finger electrodes 93 extending lengthways prevent the device from sloping when the device is placed on a mount part (e.g., a sub-mount, a package or a COB (Chip on Board)) in an upside-down position. In this regard, it is preferable to make the p-side finger electrode 93 as long as possible.

A suitable height for the p-side finger electrodes 93 and the n-side finger electrodes 81 ranges from 2 μm to 3 μm. If the finger electrodes are thinner than the range, it can cause an increase of the operating voltage; if the finger electrodes are thicker than the range, it can lead to the detriment of the process stability and an increase of the material cost.

Preferably, prior to the formation of the p-side finger electrode 93, an optical absorption barrier 95 is formed on the p-type semiconductor layer 50 on which the p-side finger electrode 93 is to be formed. The optical absorption barrier 95 is formed in such a way that it is slightly wider than the p-side finger electrode 93. The light absorption barrier 95 serves to prevent the p-side finger electrode 93 from absorbing light that is generated in the active layer 40. The optical absorption barrier 95 may only serve to reflect part or all of the light generated in the active layer 40, or may only serve to prevent the current from the finger electrode 93 from flowing to immediately below zone of the finger electrode 93, or may do both. To perform these functions, the optical absorption barrier 95 can be composed of a single layer (e.g., $SiO_2$), or a multilayer (e.g., $SiO_2/TiO_2/SiO_2$) that is made of a light-transmitting material having a refractive index lower than that of the p-type semiconductor layer 50, or a DBR or a combination of the single layer and the DBR. In addition, the optical absorption barrier 95 can be composed of a non-conductive material (e.g., a dielectric film such as $SiO_x$, $TiO_x$ or the like). A suitable thickness for the optical absorption barrier 95 is between 0.2 μm and 3.0 μm, depending on the structure. If the optical absorption barrier 95 is thinner than the range, it cannot function properly; and if the optical absorption barrier 95 is thicker than the range, it can be difficult to deposit the light-transmitting conductive film 60 on the optical absorption barrier 95. Although the light-absorption prevention film 95 does not always have to be composed of a light-transmitting material or of a non-conductive material, the effects thereof can be increased further by incorporating a light-transmitting dielectric material.

Preferably, following the formation of the optical absorption barrier 95 and prior to the formation of the p-side finger electrode 93, a light-transmitting conductive film 60 is formed on the p-type semiconductor layer 50. The light-transmitting conductive film 60 is formed on the p-type semiconductor layer 50 in such a way that it covers almost the entire p-type semiconductor layer, except for the n-side contact area 31 that is formed by a mesa etching process. In this manner, the optical absorption barrier 95 is interposed between the light-transmitting conductive film 60 and the p-type semiconductor layer 50. The light-transmitting conductive film 60 is advantageous in most cases, especially in case of a p-type GaN having a poor current spreading capability and a p-type semiconductor layer 50 composed of GaN. Examples of materials that can be used for the light-transmitting conductive film 60 include ITO, Ni/Au or the like. Once the light-transmitting conductive film 60 is formed, the p-side finger electrode 93 can be formed on the light-transmitting conductive film 60 where the optical absorption barrier 95 is placed.

Following the formation of the n-side finger electrodes 81 and the p-side finger electrodes 93, a non-conductive reflective film 91 is formed in such a way that both the n-side contact area 31 including the n-side finger electrodes 81 and the p-type semiconductor layer 50 including the p-side finger electrodes 93 are covered entirely. The non-conductive reflective film 91 serves to reflect light from the active layer 40 towards the substrate 10 used for the growth or towards the n-type semiconductor layer 30 if the substrate 10 has been removed. Preferably, the non-conductive reflective film 91 also covers the exposed side faces of the p-type semiconductor layer 50 and the active layer 40 that connect the upper face of the p-type semiconductor layer 50 and the upper face of the n-side contact area 31. A person skilled in the art should understand that it is not absolutely necessary for the non-conductive reflective film 91 to cover the entire area over the etched-exposed n-type semiconductor layer 30 and the p-type semiconductor layer 50 on the opposite side of the substrate 10.

The non-conductive reflective film 91 serves as a reflective film, yet it can preferably be composed of a light-transmitting material, for example, a light-transmitting dielectric material such as $SiO_x$, $TiO_x$, $Ta_2O_5$ or $MgF_2$, in order to avoid light absorption. The non-conductive reflective film 91 can have various structures, including a single dielectric film for example made of a light-transmitting dielectric material such as $SiO_x$, a single DBR for example including a combination of $SiO_2$ and $TiO_2$, heterogeneous plural dielectric films and any combination of a dielectric film and a DBR, and can have a thickness ranging from 3 to 8 μm, for example. The dielectric film having a refractive index lower than that of the p-type semiconductor layer 50 (e.g., GaN) can reflect part of the light having an incidence angle greater than a critical angle towards the substrate 10, the DBR can reflect a greater amount of light towards the substrate 10, and the DBR can also be designed for a specific wavelength such that it can effectively reflect light according to the wavelength of the light generated.

Preferably, as shown in FIG. 15 and FIG. 16, the non-conductive reflective film 91 has a double layer structure including a DBR 91a and a dielectric film 91b. As the deposition of the DBR 91a needs to be done with high precision, the dielectric film 91b having a uniform thickness is first formed before the deposition such that the DBR 91b can be prepared in a stable manner, and light reflection can also benefit therefrom.

In the formation of a semiconductor light-emitting device according to the present disclosure, a step (stepped portion) having height difference can be created by a mesa etching process for forming the n-side contact area 31, a component such as the p-side finger electrode 93 or the n-side finger electrode 81 with a step is required, and even after the non-conductive reflective film 91 is formed, it should be subjected to a boring process to make an opening in it as described in detail below. Therefore, special attention should be paid during the formation of the dielectric film 91b.

The dielectric film 91b is suitably made of $SiO_2$, and it preferably has a thickness between 0.2 μm and 1.0 μm. If the dielectric film 91b is thinner than the range, it is not enough to fully cover the n-side finger electrode 81 and p-side finger electrode 93 having a height ranging from 2 μm to 3 μm; and if the dielectric film 91b is thicker than the range, the subsequent boring process can be difficult to perform. The dielectric film 91b can be thicker than the following DBR 91a. Moreover, it is necessary to form the dielectric film 91b by a more appropriate method for ensuring the reliability of the device. For instance, the dielectric film 91b made of $SiO_2$ is preferably formed by CVD (Chemical Vapor Deposition) and in particular by PECVD (Plasma Enhanced CVD). This is because the steps are created during the formation of the n-side contact area 31 by mesa etching, and of the p-side finger electrode 93 and the n-side finger electrode 81, and because the CVD is more advantageous than PVD (Physical Vapor Deposition) such as E-beam evaporation in order to cover the steps. More specifically, when the dielectric film 91b is formed by E-beam evaporation, a thinner dielectric film 91b can be formed on the lateral faces of the p-side finger electrode 93 and n-side finger electrode 81 having the step, or on the tilted step face generated by mesa etching. Meanwhile, if a thinner dielectric film 91b is formed on the step faces, and especially if the p-side finger electrode 93 and the n-side finger electrode 81 are disposed below the p-side electrode 92 and the n-side electrode 80 respectively as described below, an electrical short might occur between the electrodes. Therefore, in order to ensure insulation, the dielectric film 91b is preferably formed by CVD. In this way, it is possible to secure the reliability of the semiconductor light-emitting device, while ensuring those functions as the non-conductive reflective film 91.

The DBR 91a is formed on the dielectric film 91b and composes the non-conductive reflective film 91, together with the dielectric film 91b. For instance, the DBR 91a having a repeating stacked structure composed of a combination of $TiO_2/SiO_2$ is preferably formed by PVD, and in particular by E-beam evaporation, sputtering or thermal evaporation. When the DBR 91a is composed of a combination of $TiO_2/SiO_2$, each layer is designed to have an optical thickness of one fourth of a given wavelength, and the number of its combinations is suitably between 4 and 20 pairs. If the number of pairs is smaller than the range, the reflectivity of the DBR 91a may be degraded; and if the number of pairs is larger than the range, the DBR 91a may become excessively thick.

With the non-conductive reflective film 91 thus formed, the p-side finger electrodes 93 and the n-side finger electrodes 81 are fully covered by the non-conductive reflective film 91. To enable the p-side finger electrodes 93 and the n-side finger electrodes 81 to electrically communicate with the p-side electrode 92 and the n-side electrode 80 described below, openings passing through the non-conductive reflective film 91 are formed, and the openings are then filled with an electrode material to form electrical connections 94 and 82. These openings are preferably formed by dry etching or wet etching or both. As the p-side finger electrode 93 and the n-side finger electrode 81 have narrow-width branch portions 98 and 88 respectively, the electrical connections 94 and 82 are preferably formed on the connecting parts 99 and 89 of the p-side finger electrode 93 and the n-side finger electrode 81, respectively. In absence of the p-side finger electrode 93, a number of electrical connections 94 should be formed and connected directly to the light-transmitting conductive film 60 that is prepared on almost the entire face of the p-type semiconductor layer 50. Likewise, in absence of the n-side finger electrode 81, a number of electrical connections 82 should be formed and connected directly to the n-side contact area 31. However, it is not only difficult to form a satisfactory electrical contact between the p-side electrode 92 and the light-transmitting conductive film 60 and between the n-side electrode 80 and the n-type semiconductor layer 30, many problems might also occur during the manufacturing process. In the present disclosure, however, prior to the formation of the non-conductive reflective film 91, the n-side finger electrode 81 is formed on the n-side contact area 31, and the p-side finger electrode 93 is formed either on the p-type semiconductor layer 50 or preferably on the light-transmitting conductive film 60, and these electrodes are then subjected to heat treatment, thereby making a stable electrical contact between both sides.

Once the electrical connections 94 and 82 are formed, it is desirable to form the p-side electrode 92 and the n-side electrode 80 on the non-conductive reflective film 91. Considering that the p-side electrode 92 and the n-side electrode 80 contribute to reflecting light from the active layer 40 towards the substrate 10, those electrodes are formed over a broad area to be able to cover the entire or almost the entire upper face of the non-conductive reflective film 91, thereby serving as a conductive reflective film. However, the p-side electrode 92 and the n-side electrode 80 are preferably formed at a distance from each other on the non-conductive reflective film 91. As such, there exists a portion on the non-conductive reflective film 91, which is covered neither by the p-side electrode 92 nor by the n-side electrode 80. While the p-side electrode 92 or the n-side electrode 80 may suitably be made of a material having an acceptable reflectance (e.g., Al, Ag or the like), it is preferably made of a combination of the high-reflectance material (e.g., Al, Ag or the like) and Cr, Ti, Ni, Au or any alloy thereof for obtaining a stable electrical contact. The p-side electrode 92 and the n-side electrode 80 serve to supply current to the p-side finger electrodes 93 and the n-side finger electrodes 81; to connect the semiconductor light-emitting device with external equipment; and, by occupying a broad area, to reflect the light from the active layer 40 and/or to emit the heat. Therefore, forming both the p-side electrode 92 and the n-side electrode 81 on the non-conductive reflective film 91 makes it possible to minimize the height difference between the p-side electrode 92 and the n-side electrode 80, and is advantageous when the semiconductor light-emitting device according to the present disclosure is bonded to a mount part (e.g., a sub-mount, a package or a COB). This advantage becomes more apparent especially when the eutectic bonding method is applied.

As the p-side electrode 92 and the n-side electrode 80 are formed over a broad area on the non-conductive reflective film 91, both the p-side finger electrode 93 and the n-side finger electrode 81 are placed beneath the non-conductive reflective film 91. Further, the p-side finger electrode 93 extends lengthways, passing below the n-side electrode 80 placed directly on the non-conductive reflective film 91, and the n-side finger electrode 81 extends lengthways, passing below the p-side electrode 92 placed directly on the non-conductive reflective film 91. As the non-conductive reflective films 91 are present between the p-side electrode 92 and the p-side finger electrode 93, and between the n-side electrode 80 and the n-side finger electrode 81, an electrical short between the electrodes 92 and 80 and the finger electrodes 93 and 81 can be prevented. In addition, by introducing the p-side finger electrode 93 and the n-side finger electrode 81 as described above, current can be supplied without restriction to the semiconductor layer areas of interest, in the formation of a flip-chip.

In general, the p-side electrode 92, the n-side electrode 80, the p-side finger electrode 93 and the n-side finger electrode 81 are composed of a plurality of metal layers, respectively. In case of the p-side finger electrode 93, the bottom layer thereof should have a high bonding strength with the light-transmitting conductive film 60. To this end, materials such as Cr or Ti are mainly used, but other materials such as Ni, Ti or TiW can also be used as there are no particular limitations regarding this matter. A person skilled in the art should understand that Al or Ag having a high reflectance can also be employed for the p-side finger electrode 93 and the n-side finger electrode 81. In case of the p-side electrode 92 and the n-side electrode 80, Au is used for their top layers for wire bonding or for the connection with an external electrode. Meanwhile, in order to reduce the amount of Au used and to complement a relatively low hardness of Au, other material such as Ni, Ti, TiW or W, depending on the specifications required, or Al or Ag, when a high reflectance is required, can be employed between the bottom layer and the top layer. In the present disclosure, since the p-side finger electrode 93 and the n-side finger electrode 81 need to be electrically connected to the electrical connections 94 and 82, Au could be considered for use as the top layers for finger electrodes 93 and 81. However, the inventors found out that it is not appropriate to use Au as the top layers for the p-side finger electrodes 93 and the n-side finger electrodes 81, because the non-conductive reflective film 91 can be easily peeled off due to a weak bonding strength between the Au and the non-conductive reflective film 91 at the time of deposition of the non-conductive reflective film 91 onto the Au top layer. To resolve this concern, other materials such as Ni, Ti, W, TiW, Cr, Pd or Mo can be employed in replace of Au to form the top layers of the finger electrodes. In this way, the bonding strength between the top layers and the non-conductive reflective film 91 to be deposited on the top layers is retained and the reliability can thus be improved. Further, those metals mentioned above are fully capable of functioning as a diffusion barrier during the formation of an opening in the non-conductive reflective film 91 to create the electrical connection 94, which can be helpful for ensuring the stability of the subsequent processes and the electrical connections 94 and 82.

Figure 18:
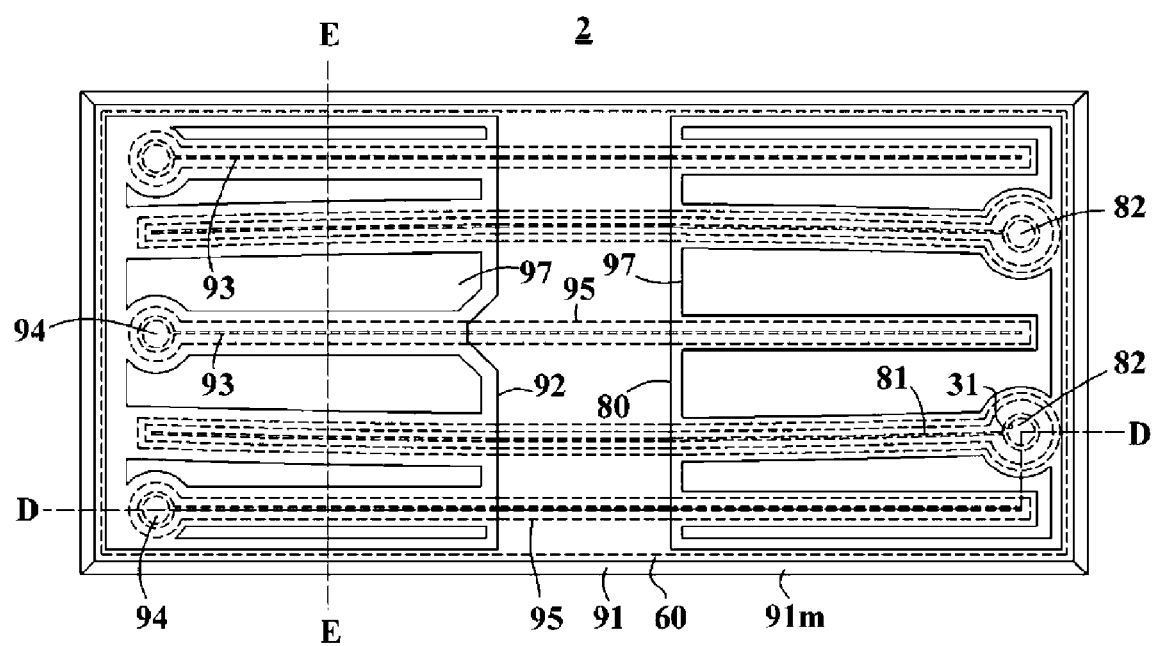
FIG. 18 is a view illustrating yet another example of the semiconductor light-emitting device according to the present disclosure.
Figure 19:
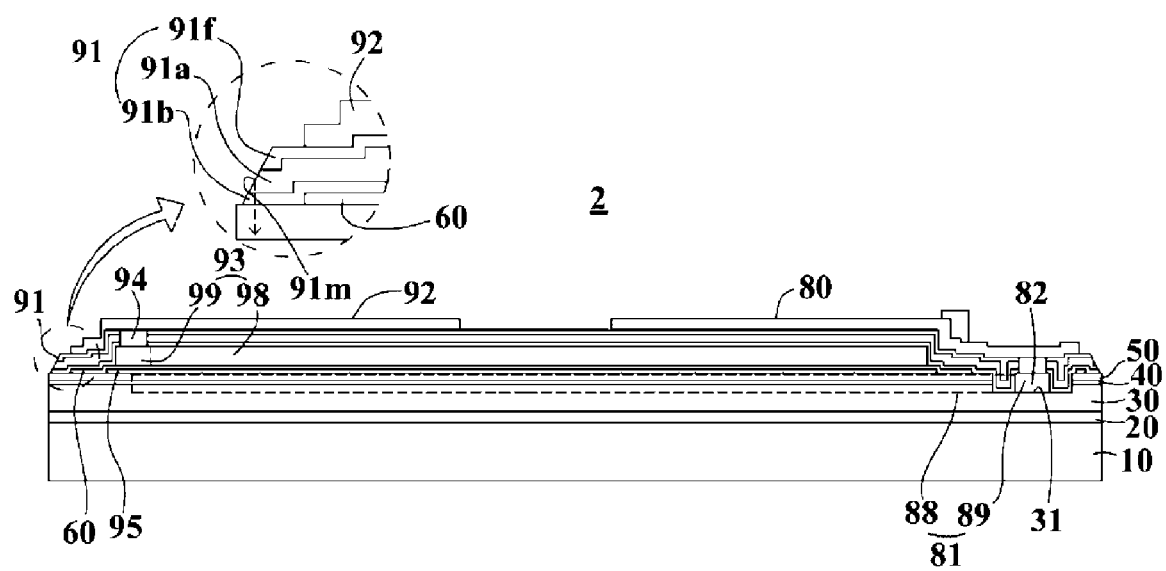
FIG. 19 is a cross-sectional view taken along line D-D in FIG. 18.
Figure 20:
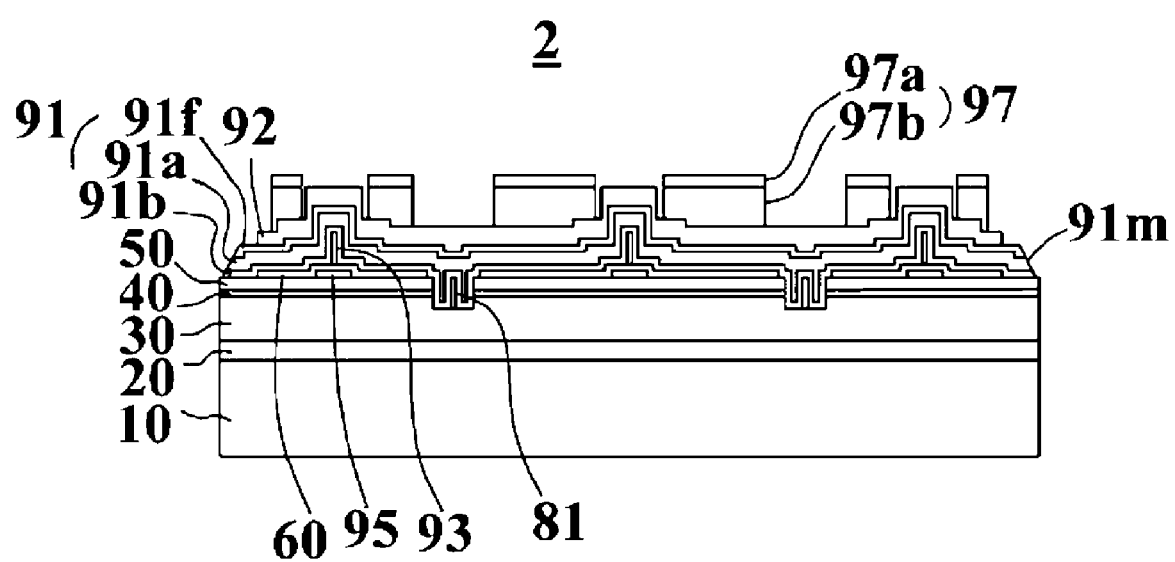
FIG. 20 is a cross-sectional view taken along line E-E in FIG. 18.

FIG. 18 is a view illustrating yet another example of the semiconductor light-emitting device according to the present disclosure, FIG. 19 is a cross section view taken along line D-D of FIG. 18, and FIG. 20 is a cross section view taken along line E-E of FIG. 18.

As shown in FIG. 19 and FIG. 20, in a semiconductor light-emitting device 2 according to the present disclosure, a non-conductive reflective film 91 further includes, in addition to a dielectric film 91b and a DBR 91a, a clad film 91f to be formed on the DBR 91a. Although a large portion of light generated in the active layer 40 is reflected by the dielectric film 91b and the DBR 91a towards an n-side semiconductor layer 30, part of the light is trapped inside the dielectric film 91b and the DBR 91a as they also have a certain thickness, or emitted through the lateral faces of the dielectric film 91b and the DBR 91b. The inventors analyzed the relation among the dielectric film 91b, the DBR 91a and the clad film 91f, from the perspective of an optical waveguide. The optical waveguide is a structure that encloses a propagation part of light by a material having a refractive index lower than that of the propagation part of light and guides the light utilizing total reflection. In this regard, if the DBR 91a is considered as the propagation part, the dielectric film 91b and the clad film 91f can be regarded as part of the structure that encloses the propagation part. When the DBR 91a is composed of $SiO_2/TiO_2$, with $SiO_2$ having a refractive index of 1.46 and $TiO_2$ having a refractive index of 2.4, an effective refractive index (which denotes an equivalent refractive index of light that can travel in a waveguide that is made of materials having different refractive indices, and has a value between 1.46 and 2.4) of the DBR 91a is higher than that of the dielectric film 91b composed of $SiO_2$. The clad film 91f is also composed of a material having an effective refractive index lower than that of the DBR 91a. Preferably, the clad film 91f has a thickness which desirably ranges from λ/4n to 3.0 μm, where λ denotes a wavelength of the light generated in the active layer 40, and n denotes a refractive index of a material composing the clad film 91f. By way of example, the clad film 91f can be composed of a dielectric such as $SiO_2$ having a refractive index of 1.46. When λ is 450 nm (4500 Å), the clad film 91f can be formed in a thickness of 771 Å (4500/4×1.46=771 Å) or more. Considering that the top layer of the DBR 91a made of multiple pairs of $SiO_2/TiO_2$ can be composed of a $SiO_2$ layer having a thickness of λ/4n, it is desirable that the clad film 91f is thicker than λ/4n to be distinguished from the top layer of the DBR 91a that is placed beneath the clad film 91f. Although it is not desirable for the top layer of the DBR 91a to be too thick (e.g., 3 μm or more), imposing a burden on the subsequent boring process and only increasing the material cost without contributing to the improvement of the efficiency, it is not impossible, depending on the case, to make the top layer as thick as 3.0 μm or more. When the DBR 91a comes in a direct contact with the p-side electrode 92 and the n-side electrode 80, part of the light travelling through the DBR 91a might be affected by the p-side electrode 92 and the n-side electrode 80 and then absorbed. However, interposing the clad film 91f having a refractive index lower than that of the DBR 91a between the p- and n-side electrodes (92, 80) and the DBR 91a can minimize the partial absorption of the light traveling through the DBR 91a by the p-side electrode 92 and the n-side electrode 80, thereby increasing the efficiency of light extraction. Accordingly, the clad film 91f should generally have at least a thickness corresponding to the wavelength of light to achieve the effect described above, and therefore it preferably has a thickness of at least Δ/4n. Meanwhile, if there is a big difference between the refractive index of the DBR 91a and the refractive index of the clad film 91f, the DBR 91a may restrict light more strongly such that a thinner clad film 91f could be used. However, if the difference between the refractive indices is small, the clad film 91f is needed to be sufficiently thick to obtain the effect described above. Thus, the thickness of the clad film 91f is determined with full consideration of a difference between the refractive index of a material constituting the clad film 91f and the effective refractive index of the DBR 91a. For instance, if the clad film 91f is composed of $SiO_2$ and the DBR 91a is composed of $SiO_2/TiO_2$, a suitable thickness for the clad film 91f will be at least 0.3 μm to be distinguished from the top layer of the DBR 91a composed of $SiO_2$. On the other hand, the maximum thickness of the clad film 91f is preferably between 1 μm and 3 μm, not to impose any burden on the subsequent boring process.

The clad film 91f is not particularly limited as long as its refractive index is lower than the effective refractive index of the DBR 91a, and can be composed of a metal oxide such as $Al_2O_3$, a dielectric film such as $SiO_2$ or SiON, or other material such as MaF or CaF. If a difference in the refractive indices is small, the clad film should be made thicker to obtain the desired effect. Also, in case of using $SiO_2$ for the clad film, it is possible to use $SiO_2$ having a refractive index lower than 1.46 to increase the efficiency.

One can envisage that the dielectric film 91b can be omitted from the non-conductive reflective film 91. Although not desirable in terms of an optical waveguide, there is no reason to exclude the configuration of the non-conductive reflective film 91 composed of the DBR 91a and the clad film 91f, when the overall technical spirit of the present disclosure is taken into consideration. Also one can envisage that the non-conductive reflective film 91 may have a $TiO_2$ dielectric film in replace of the DBR 91a. Further, one can envisage that the clad film 91f can be omitted from the non-conductive reflective film 91, if the DBR 91a includes a $SiO_2$ layer on the top thereof.

The non-conductive reflective film 91, which is composed of the DBR 91a having a high effective reflectance, and the dielectric film 91b and the clad film 91f, each having a low reflectance, disposed on the top and bottom of the DBR 91a, respectively, serves as an optical waveguide, and preferably has an overall thickness ranging from of 3 μm to 8 μm. Also, the non-conductive reflective film 91 preferably has an inclined face 91m on the edge. This inclined face 91m can be formed, for example, by a dry etching process. Among light lays that are incident on the non-conductive reflective film 91 that serves as an optical waveguide, the light rays that are incident on the non-conductive reflective film 91 at right angles or almost at right angles are well reflected towards the substrate 10, but some light rays including those that are incident on the non-conductive reflective film 91 at an oblique angle are not reflected towards the substrate 10 and instead can be trapped inside the DBR 91a that serves as a propagation part, and then can be propagated towards the lateral face. As such, the light rays propagated towards the lateral surface of the DBR 91a are either emitted to the outside or reflected towards the substrate 10, at the inclined face 91m of the edge of the non-conductive reflective film 91. That is to say, the inclined face 91m on the edge of the non-conductive reflective film 91 serves as a corner reflector and contributes to the improved brightness of the semiconductor light-emitting device. The inclined face 91m is suitably at an angle ranging from 50 to 70 degrees, to facilitate the light reflection towards the substrate 10. The inclined face 91m can easily be formed by wet etching or dry etching, or both.

Figure 21:
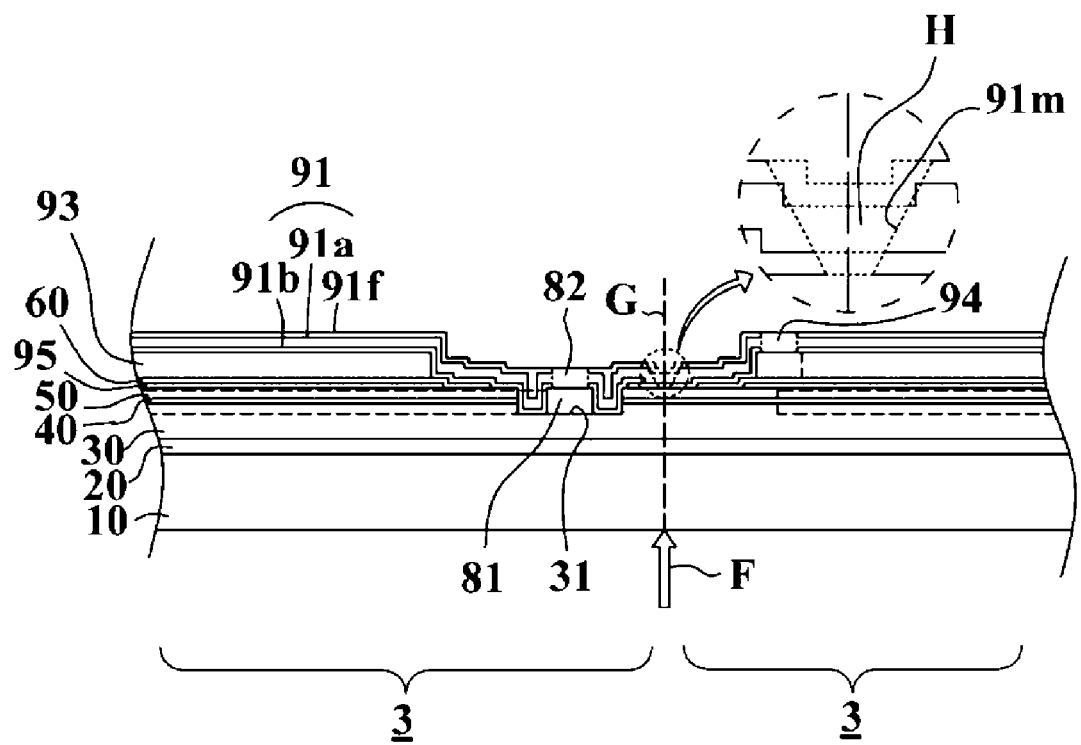
FIG. 21 is a view illustrating a state before two semiconductor light-emitting devices are divided into individual semiconductor light-emitting devices during the manufacturing process of a semiconductor light-emitting device.
Figure 22:
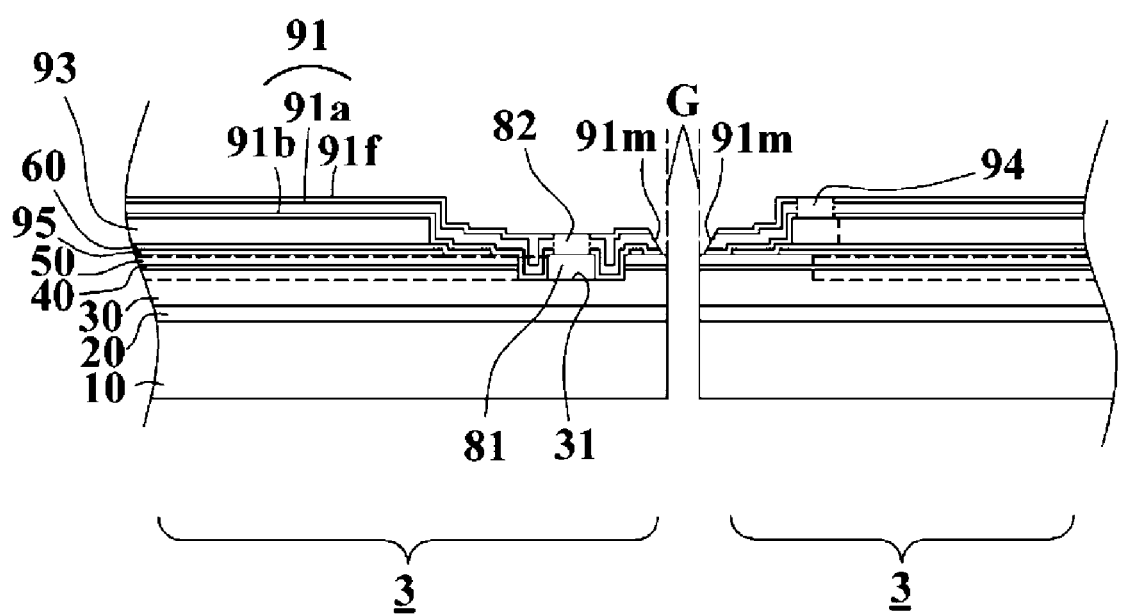
FIG. 22 is a view illustrating a state where two semiconductor light-emitting devices are divided into individual semiconductor light-emitting devices during the manufacturing process of a semiconductor light-emitting device.

FIG. 21 is a view illustrating a state of two semiconductor light-emitting devices before they are divided into individual semiconductor light-emitting devices, during the manufacturing process of a semiconductor light-emitting device; and FIG. 22 is a view illustrating a state of two semiconductor light-emitting devices after they are divided into individual semiconductor light-emitting devices, during the manufacturing process of a semiconductor light-emitting device. For reference, those semiconductor light-emitting devices 3, shown in FIG. 21 and FIG. 22 for explaining the manufacturing process, are in a state where none of the p-side electrode 92, n-side electrode 80 and bonding pad 97 is formed.

Usually a semiconductor light-emitting device is first prepared in a wafer form including a plurality of semiconductor light-emitting devices, and then divided into individual semiconductor light-emitting devices by cutting, such as breaking, sawing, or scribing-and-breaking. In the scribing-and-breaking operation, the scribing process employs a laser and can be performed by focusing the laser onto the substrate side including the surface and the interior of the substrate of the semiconductor light-emitting device. In this scribing process employing the laser, the semiconductor light-emitting device 3 is preliminarily cut along the boundary G of the edge of the semiconductor light device 3, i.e., along the boundary G between the semiconductor light-emitting device 3 and another neighboring semiconductor light-emitting device 3. These preliminarily cut semiconductor light-emitting device is completely divided into individual semiconductor light-emitting devices through the breaking process that is performed following the scribing process. The breaking process is performed by applying an external force along the boundary G between the semiconductor light-emitting device 3 and another neighboring semiconductor light-emitting device 3, for example, in the direction of the substrate 10 indicated by an arrow F in FIG. 21, or in the opposite direction thereof. In this breaking process, the substrate 10 and the semiconductor layers 20, 30 40 and 50, which are crystalline, can be cut precisely along the boundary G; while the non-conductive reflective film 91 over the p-type semiconductor layer 50, which is non-crystalline, cannot be cut precisely along the boundary G and, in the areas around the edge of the non-conductive reflective film 91, it is likely to sustain damage such as crack generation thereto. The damage of the areas around the edge of the non-conductive reflective film 91 may lead to poor yields due to those appearance defects. Preferably, during the manufacturing of a semiconductor light-emitting device, a plurality of semiconductor light-emitting devices is prepared in a wafer form, and then, prior to the scribing and braking processes using a laser for dividing the semiconductor light-emitting devices into individual ones, a certain area H of the non-conductive reflective film 91 around the boundary G between a semiconductor light-emitting device and another neighboring semiconductor light-emitting device is eliminated. In terms of the individual semiconductor light-emitting device, the certain area H of the non-conductive reflective film 91 to be eliminated along the boundary G of the semiconductor light-emitting device 3 corresponds to an edge area of the non-conductive reflective film 91. The elimination of a certain area H of the non-conductive reflective film 91 around the boundary G can also indicate that, before the semiconductor light-emitting devices is divided into individual ones, the non-conductive reflective film 91 of one semiconductor light-emitting device and the non-conductive reflective film 91 of another neighboring semiconductor light-emitting device are spaced apart from each other. With a part of the areas of the edge of the non-conductive reflective film 91 being eliminated, even if the subsequent scribing and breaking processes may be performed using a laser, the appearance defect caused by the damaged edge of the non-conductive reflective film 91 of each semiconductor light-emitting device can be avoided, thereby increasing yields. For instance, the elimination of a certain area H of the non-conductive reflective film 91 can be carried out by dry etching, and it should be performed prior to the breaking process in the overall semiconductor manufacturing process. However, when the openings passing through the non-conductive reflective film 91 to form electrical connections 94 and 82 are formed by dry etching, it is preferable to form those openings at the same time. Although the inclined face 91m serving as a corner reflector can be obtained by a separate etching process, the inclined face 91m can be formed simultaneously in a process of eliminating the edge area of the non-conductive reflective film 91 to avoid damage, by etching the edge portion of the non-conductive reflective film 91 of an individual semiconductor light-emitting device.

As shown in FIG. 18 and FIG. 20, a bonding pad 97 can be provided on the p-side electrode 92 and on the n-side electrode 80 respectively, as a part of each of the p-side electrode 92 and the n-side electrode 80. The top face of the bonding pad 97 on the p-side electrode 92 has the same height as the top face of the bonding pad 97 on the n-side electrode 80. That is to say, the top face of the bonding pad 97 on the p-side electrode 92 and the top face of the bonding pad 97 on the n-side electrode 80 lie on the same plane. When a semiconductor light-emitting device is coupled with an external equipment by, for example, the eutectic bonding method, those bonding pads 97 allow the p-side electrode 92 and the n-side electrode 80 to have an equal final height to thus avoid any tilting on the mount part, provide a broad and planar coupling face to thus obtain an excellent bonding strength, and dissipates the heat from the inside of the semiconductor light-emitting device to the outside. A plurality of bonding pads 97 can be provided on the p-side electrode 92 and on the n-side electrode 80, respectively, and the plurality of bonding pads 97 is preferably formed on the positions where the n-side finger electrodes 81 and the p-side finger electrodes 93 are not overlapped, i.e., among the n-side finger electrodes 81 and the p-side finger electrodes 93. In other words, the bonding pads 97 are formed on the areas of the p-side electrode 92 and on the n-side electrode 80, except on the p-side finger electrodes 93 corresponding to the upper most protruded portion and on the n-side finger electrodes 81 corresponding to the lower most recessed portion. In addition, the bonding pad 97 can have a double layer structure including an underlying spacer layer 97a and a bonded layer 97b overlying the spacer layer 97a, and has a total thickness ranging from 5 µm to 6 µm, for example. In one example, the spacer layer 97a may be composed of a metal layer including Ni, Cu or a combination thereof, and the bonded layer 97b may be composed of a eutectic bonding layer including a Ni/Sn, Ag/Sn/Cu, Ag/Sn, Cu/Sn or Au/Sn combination and having a thickness of about several µm. The spacer layer 97a can serve as a wetting layer and as a diffusion barrier for a solder used in the eutectic bonding, and can also reduce the cost burden as compared with a case where the bonding pad 97 is entirely formed of a eutectic bonded layer 97b containing expensive Au. To match the final height of the bonding faces during the bonding operation (e.g., the eutectic bonding operation), the bonding pads 97 are preferably formed to be taller than the most protruded portion of the p- and n-side electrodes 92 and 80, namely, the height of the upper portion of the p-side finger electrode, by 1 to 3 µm. Accordingly, during the bonding operation, excellent bonding results are obtained between the semiconductor light-emitting device and the mount part, and heat dissipation of the semiconductor light-emitting device is facilitated. Here, the spacer layer 97a and the bonded layer 97b can be formed by various methods, such as plating, E-beam evaporation, thermal evaporation or the like.

Referring to FIG. 15 and FIG. 16, all areas of the n-type semiconductor layer 30, except the n-side contact area 31, is preferably covered with the active layer 40 and the p-type semiconductor layer 50. That is to say, for the semiconductor light-emitting device 100, the target etching area is limited to the n-side contact area 31, and there is no other area including the edges to be etched. Those lateral faces around the semiconductor light-emitting device 100 are all cut faces obtained by the scribing-and-braking process or the like. As such, the area of the active layer 40 generating light increases and the efficiency of light extraction is thus improved. Moreover, the step faces produced from the etching process are minimized; namely, those step faces are limited to the exposed lateral faces of the active layer 40 and the p-type semiconductor layer 50 that connect the top face of the p-type semiconductor layer 50 with the top face of the n-side contact area 31. These exposed lateral faces of the active layer 40 and the p-type semiconductor layer 50 are the portions where it is hard, in particular, to deposit the DBR 91a constituting the non-conductive reflective film 91 during the formation of the non-conductive reflective film 91. Consequently, the DBR 91a on the exposed lateral faces of the active layer 40 and the p-type semiconductor layer 50 may have relatively lower reflection efficiency. As the exposed lateral faces of the active layer 40 and the p-type semiconductor layer 50 are minimized, it is possible to minimize areas having low reflection efficiency in the DBR 91a, thereby increasing the overall reflection efficiency.

Figure 23:
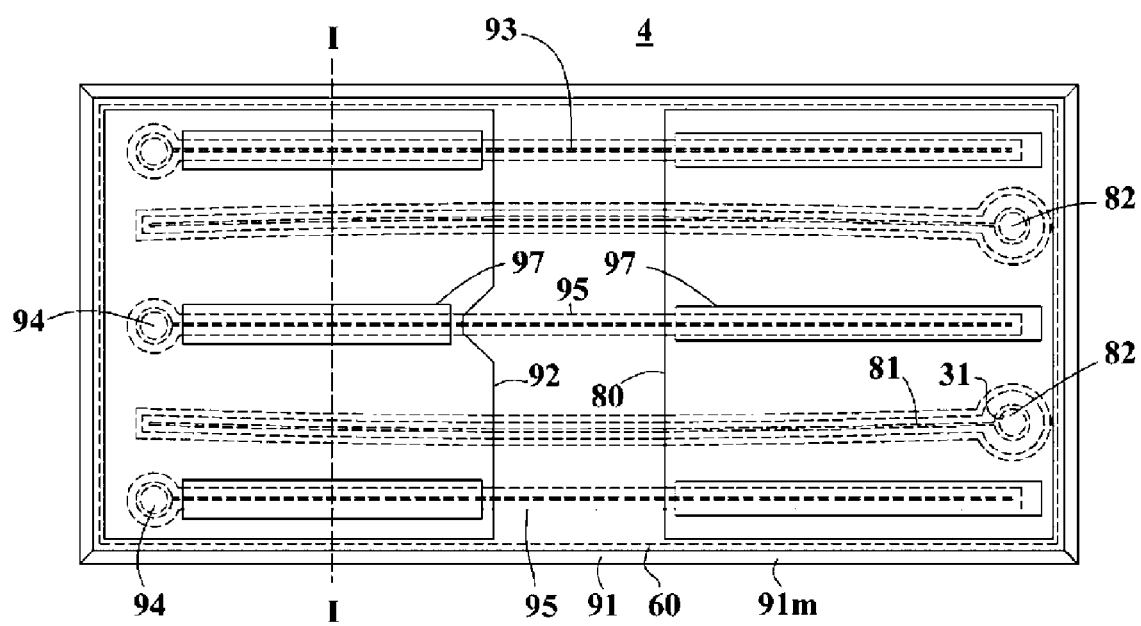
FIG. 23 is a view illustrating yet another example of the semiconductor light-emitting device according to the present disclosure.
Figure 24:
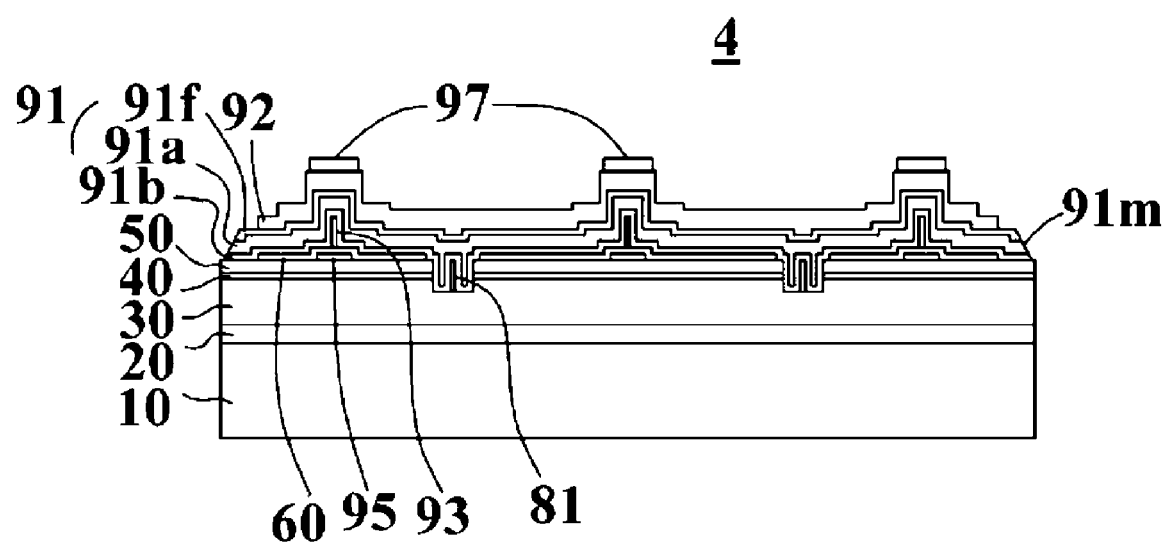
FIG. 24 is a cross-sectional view taken along line I-I in FIG. 23.

FIG. 23 is a view illustrating yet another example of the semiconductor light-emitting device according to the present disclosure, and FIG. 24 is a cross-sectional view taken along line I-I in FIG. 23.

As shown in FIG. 23 and FIG. 24, the bonding pad 97 can be formed on a part on the p-side finger electrode 93, the most upwardly protruded portion among the p-side electrodes 92 and the n-side electrodes 80. In this case, the bonding pad 97 can be as thin as 2 to 3 μm, and composed of the bonded layer 97b (i.e. the eutectic bonding layer) only, instead of including the spacer layer 97a as well as the bonded layer 97b.

Figure 25:
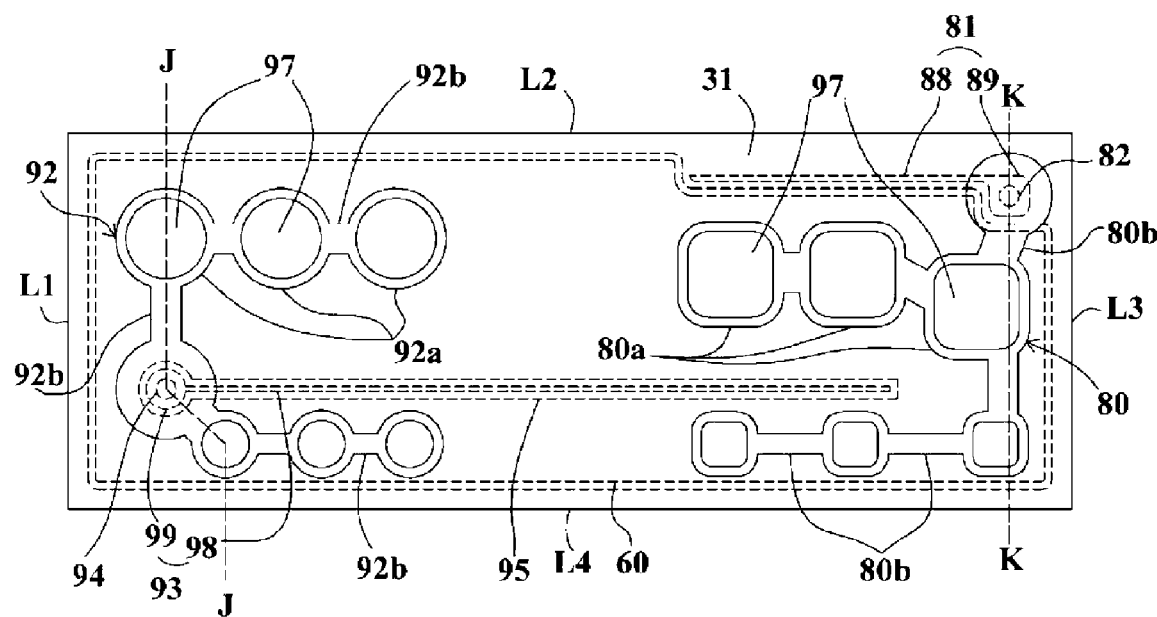
FIG. 25 is a view illustrating still another example of the semiconductor light-emitting device according to the present disclosure.
Figure 26:
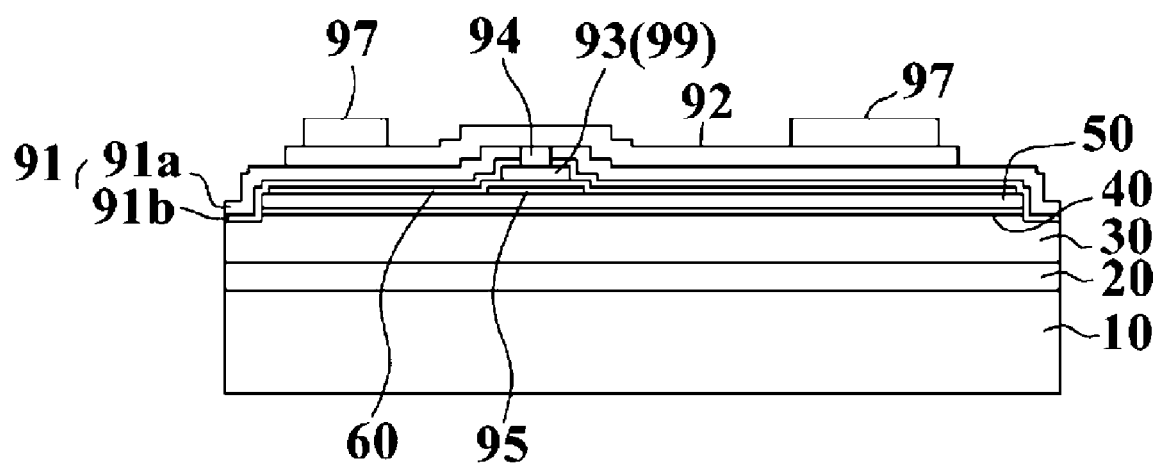
FIG. 26 is a cross-sectional view taken along line J-J in FIG. 25.
Figure 27:
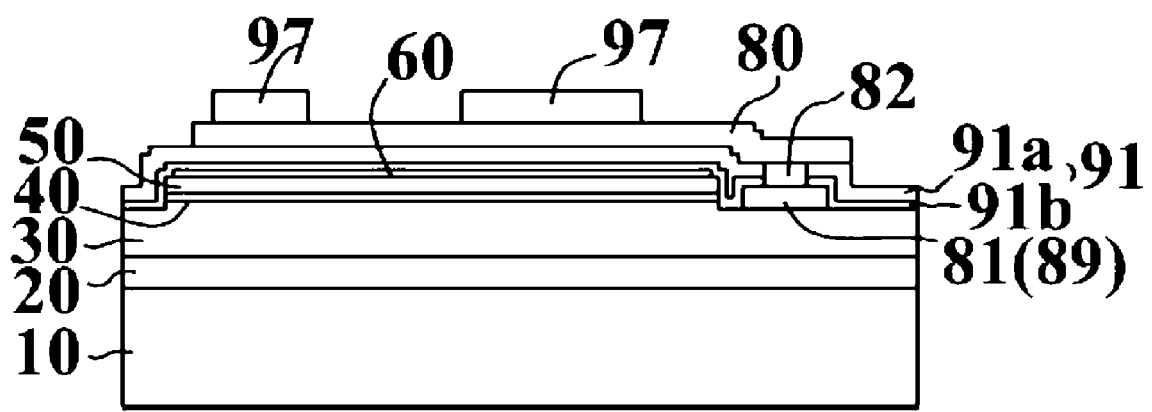
FIG. 27 is a cross-sectional view taken along line K-K in FIG. 25.

FIG. 25 is a view illustrating still another example of the semiconductor light-emitting device according to the present disclosure, FIG. 26 is a cross-sectional view taken along line J-J in FIG. 25, and FIG. 27 is a cross-sectional view taken along line K-K in FIG. 25.

The semiconductor light-emitting device 5 includes a substrate 10, a buffer layer 20 growing on the substrate 10, an n-type semiconductor layer 30 growing on the buffer layer 20, an active layer 40 growing on the n-type semiconductor layer 30 and generating light by recombination of electrons and holes, and a p-type semiconductor layer 50 growing on the active layer 40. The semiconductor light-emitting device 5 has a quadrangular planar shape having four sides, a first side L1 on the left, a third side L3 on the right oppositely to the first side L1, a second side L2 on the top, and a fourth side L4 on the bottom oppositely to the second side L2.

Portions of the p-type semiconductor layer 50 and the active layer 40 are removed by a mesa etching process, and as a result thereof, n-side contact areas 31 exposing the n-type semiconductor layer 30 are formed and an n-side finger electrode 81 is formed on the n-type semiconductor layer 30 within each of the n-side contact areas 31. While the n-side contact area 31 in FIG. 25 is formed by extending from the corner where the second side L2 and the third side L3 meet towards the first side L1, running along the second side L2, it can also vary in locations by extending from the middle part of the third side L3 towards the first side L1. Moreover, while the n-side contact area 31 in FIG. 25 is open towards the second side L2 and the third side L3, it is preferably circumferentially surrounded and blocked by the active layer 40 and the p-type semiconductor layer 50, without being open towards any of the sides. The number of the n-side contact areas 31 may be higher or lower, and the array configuration thereof can also vary. The n-side finger electrode 81 preferably includes a branch portion 88 extended lengthways, and a connecting portion 89 formed at one end of the branch portion 88 to have a greater width. As such, the n-side contact area 31 has a smaller width at the part where the branch portion 88 of the n-side finger electrode 81 is disposed and a greater width at the part where the connecting portion 89 of the n-side finger electrode 81 is disposed. The n-side finger electrode 81 can be omitted.

A P-side finger electrode 93 is formed on the p-type semiconductor layer 50. The p-side finger electrode 93 is formed in parallel with the n-side finger electrodes 81 by extending from the first side L1 to the third side L3, and is slightly offset towards the fourth side L4 in consideration of the position of the n-side finger electrode 81. Also, the p-side finger electrode 93 preferably includes a branch portion 98 extended lengthways, and a connecting portion 99 formed at one end of the branch portion 98 to have a greater width. Meanwhile, as shown in FIG. 25, the connecting portion 99 of the p-side finger electrode 93 is placed on the opposite side of the connecting portion 89 of the n-side finger electrode 81, when the semiconductor light-emitting device is seen from the top. That is to say, the connecting portion 99 of the p-side finger electrode 93 is placed on the left side, while the connecting portion 89 of the n-side finger electrode 81 is placed on the right side. The p-side finger electrode 93 extends along the direction of the second side L2 and the fourth side L4 of the semiconductor light-emitting device.

Prior to the formation of the p-side finger electrode 93, an optical absorption barrier 95 is formed on the p-type semiconductor layer 50 on which the p-side finger electrode 93 is to be formed. The optical absorption barrier 95 is formed in such a way that it is slightly wider than the p-side finger electrode 93. The light-absorption preventing layer 95 serves to prevent the p-side finger electrode 93 from absorbing light that is generated in the active layer 40.

Following the formation of the optical absorption barrier 95 and prior to the formation of the p-side finger electrode 93, a light-transmitting conductive film 60 is formed on the p-type semiconductor layer 50. The light-transmitting conductive film 60 is formed on the p-type semiconductor layer 50 in such a way that it covers almost the entire p-type semiconductor layer, except for the n-side contact area 31 that is formed by a mesa etching process. In this manner, the optical absorption barrier 95 is interposed between the light-transmitting conductive film 60 and the p-type semiconductor layer 50. Once the light-transmitting conductive film 60 is formed, the p-side finger electrode 93 is formed on the light-transmitting conductive film 60 where the optical absorption barrier 95 is placed.

Following the formation of the n-side finger electrodes 81 and the p-side finger electrodes 93, a non-conductive reflective film 91 is formed in such a way that both the n-side contact area 31 including the n-side finger electrodes 81 and the p-type semiconductor layer 50 including the p-side finger electrodes 93 are covered entirely. The non-conductive reflective film 91 serves to reflect light from the active layer 40 towards the substrate 10 used for the growth or towards the n-type semiconductor layer 30 if the substrate 10 has been removed. Preferably, the non-conductive reflective film 91 also covers the exposed side faces of the p-type semiconductor layer 50 and the active layer 40 that connect the upper face of the p-type semiconductor layer 50 and the upper face of the n-side contact area 31. A person skilled in the art should understand that it is not absolutely necessary for the non-conductive reflective film 91 to cover the entire area over the etched-exposed n-type semiconductor layer 30 and the p-type semiconductor layer 50 on the opposite side of the substrate 10. In FIG. 26 and FIG. 27, the non-conductive reflective film 91 has a duel structure of a DBR 91a and a dielectric film 91b. However, as described above, the non-conductive reflective film 91 can be composed of various combinations. With the non-conductive reflective film 91 thus formed, the p-side finger electrode 93 and the n-side finger electrode 81 are fully covered by the non-conductive reflective film 91.

To enable the p-side finger electrode 93 and the n-side finger electrode 81 to electrically communicate with the p-side electrode 92 and the n-side electrode 80 described below, openings passing through the non-conductive reflective film 91 are formed, and the openings are then filled with an electrode material to form electrical connections 94 and 82. As the p-side finger electrode 93 and the n-side finger electrode 81 have narrow-width branch portions 98 and 88 respectively, the electrical connection 94 is placed on the connecting portion 99 of the p-side finger electrode 93 on the first side L1, and the electrical connection 82 is placed on the connecting part 89 of the n-side finger electrode 81 on the third side L3.

Following the formation of the electrical connections 94 and 82, the p-side electrode 92 and the n-side electrode 80 are formed on the non-conductive reflective film 91. The p-side electrode 92 and the n-side electrode 80 are not necessarily formed broadly on the non-conductive reflective film 91. As the p-type semiconductor layer 50 and the n-type semiconductor layer 30 in the n-side contact area 31 are formed such that they are all covered by the non-conductive reflective film 91, the reflection effect by the p-side electrode 92 and the n-side electrode 80 is then no longer absolutely essential, and the heat dissipation effect is hardly affected because once the area is larger than a certain degree the heat dissipation effect is not much increased. Besides, making larger p-side and n-side electrodes 92 and 80 can increase the material cost.

The p-side electrode 92 and the n-side electrode 80 on the non-conductive reflective film 91 are spaced apart from each other to avoid an electrical short.

The p-side electrode 92 is formed on the non-conductive reflective film 91, and has at least two pad seats 92a of a large width to hold a bonding pad 97 to be described later thereon, and at least one joint 92b of a smaller width for connecting the pad seats 92a. A portion that overlaps with the p-side finger electrode 93 of a joint 92b among other joints, with the joint 92b passing above the p-side finger electrode 93, i.e. a portion above the electrical connection 94 is preferably formed to have a large width. As shown in FIG. 25, the p-side electrode 92 is formed in such a manner that it is branched off from the second side L2 and the fourth side L4 in a portion in parallel with the first side L1 into two sections and extended towards the third side L3. If the p-side finger electrode 93 and the n-side finger electrode 81 are not overlapped, the p-side electrode can also be formed in other various shapes, for example, three split sections including a section that is branched off from the middle of a portion in parallel with the first side L1 and extended towards the third side L3. The p-side electrode 92 is electrically connected to the p-type semiconductor layer 50 by the electrical connection 94 below the joint 92b of the first side L1 that is in electrical communication with the p-type finger electrode 93. The p-side electrode 92 and the p-side finger electrode 93 are overlapped only where the electrical connection 94 is placed, and they are not overlapped in any other places.

Similarly, the n-side electrode 80 is also formed on the non-conductive reflective film 91, and has at least two pad seats 80a of a large width to hold a bonding pad 97 to be described later thereon, and joints 80b of a smaller width for connecting the pad seats 80a or for connecting between the pad seats 80a and the electrical connection 82. A portion that overlaps with the n-side finger electrode 81 of a joint 80b among other joints, with the joint 80b passing above the 0-side finger electrode 81, i.e. a portion above the electrical connection 82 is preferably formed to have a large width. As shown in FIG. 25, the n-side electrode 80 is formed in such a manner that it is branched off from the second side L2 and the fourth side L4 in a portion in parallel with the third side L3 into two sections and extended towards the first side L1. If the p-side finger electrode 93 and the n-side electrode 81 are not overlapped, the p-side electrode can also be formed in other various shapes, for example, three split sections including a section that is branched off from the middle of a portion in parallel with the third side L3 and extended towards the first side L1. The n-side electrode 80 is electrically connected to the n-type semiconductor layer 90 by the electrical connection 82 below the joint 80b of the third side L3 that is in electrical communication with the n-type finger electrode 81. The n-side electrode 80 and the n-side finger electrode 81 are overlapped only where the electrical connection 82 is placed, and they are not overlapped in any other places. When the n-side finger electrode 81 is omitted, the n-side electrode 80 would be in direct electrical communication with the n-type semiconductor layer 30 by means of the electrical connection 82.

As shown in FIG. 25 to FIG. 27, a bonding pad 97 can be provided on the p-side electrode 92 and on the n-side electrode 80 respectively, as a part of each of the p-side electrode 92 and the n-side electrode 80. The top face of the bonding pad 97 formed on the pad seat 92a of the p-side electrode 92 has the same height as the top face of the bonding pad 97 formed on the pad seat 80a of the n-side electrode 80. That is to say, the top face of the bonding pad 97 on the p-side electrode 92 and the top face of the bonding pad on the n-side electrode 80 lie on the same plane. When a semiconductor light-emitting device is coupled with an external equipment by, for example, the eutectic bonding method, those bonding pads 97 allow the p-side electrode and the n-side electrode to have an equal final height to thus avoid any tilting on the mount part, provide a broad and planar coupling face to thus obtain an excellent bonding strength, and dissipates the heat from the inside of the semiconductor light-emitting device to the outside.

A plurality of bonding pads 97 can be provided on the p-side electrode 92 and on the n-side electrode 80, respectively. For instance, for the p-side electrode 92, at least two bonding pads 97 can be provided at a region closer to the second side L2 and the fourth side L4 adjacent to the first side L1, and additional bonding pads 97 arranged in parallel with the second side L2 and the fourth side L4, respectively. Similarly, for the n-side electrode 80, at least two bonding pads 97 can be provided at a region closer to the second side L2 and the fourth side L4 adjacent to the third side L3, and additional bonding pads 97 arranged in parallel with the second side L2 and the fourth side L4, respectively. To match the final height of the bonding faces during the bonding operation (e.g., a eutectic bonding operation), the bonding pads 97 on the p-side electrode 92 and the n-side electrode 80 are preferably formed to be taller than the most protruded portion of the p-side electrode 92, namely, the height of the upper portion of the p-side finger electrode 93 where the electrical connection 94 is placed, by 1 to 3 μm. Accordingly, during the bonding operation, excellent bonding results are obtained between the semiconductor light-emitting device and the mount part, and heat dissipation of the semiconductor light-emitting device is facilitated. The p-side electrode 92 and the n-side electrode 80 do not overlap with the p-side finger electrode 93 and the n-side finger electrode 81, except where the electrical connections 94 and 82 are placed. As the bonding pads 97 on the p-side electrode as well as the bonding pads 97 on the n-side electrode 80 are not formed where the electrical connections 94 and 82 are overlapped, the bonding pads 97 are then formed where the p-side finger electrode 93 as well as the n-side finger electrode 81 are not overlapped.

In addition, the bonding pad 97 can have a double layer structure including an underlying spacer layer 97a and a bonded layer 97b overlying the spacer layer 97a, and has a total thickness ranging from 5 μm to 6 μm, for instance. In one example, the spacer layer 97a may be composed of a metal layer including Ni, Cu or a combination thereof, and the bonded layer 97b may be composed of a eutectic bonding layer including a Ni/Sn, Ag/Sn/Cu, Ag/Sn, Cu/Sn or Au/Sn combination and having a thickness of about several μm. The spacer layer 97a can serve as a wetting layer and as a diffusion barrier for a solder used in the eutectic bonding, and can also reduce the cost burden as compared with a case where the bonding pad 97 is entirely formed of a eutectic bonded layer 97b containing expensive Au. Here, the spacer layer 97a and the bonded layer 97b can be formed by various methods, such as plating, E-beam evaporation, thermal evaporation or the like.

As mentioned above, in order to avoid an excessive increase in the area of the p-side electrode 92 and the n-side electrode 80, these electrodes are more broadly formed only at some parts of the pad seats 92a and 80a where the bonding pads 97 are placed and of the joints 92b and 80b in communication with the electrical connections 94 and 82, and they are more narrowly formed in the remaining part. Therefore, placing a limitation on an excessive increase in the area of the p-side electrode 92 and the n-side electrode 80 on the non-conductive reflective film 91 together with proper arrangement of the bonding pads 97 on the p-side electrode 92 and the n-side electrode 80 can reduce the cost burden and provide stable heat dissipation effects. Moreover, less light absorption by the p-side electrode 92 and the n-side electrode 80 can be led to a high efficiency of light extraction. In other words, it is possible to obtain sufficient heat dissipation effects through bonding pads 97 that are arranged like islands, and at the same time, to obtain an optimal operating voltage as the p-side electrode 92 and the n-side electrode 80 below the bonding pads 97 are formed in limited areas only. Also, as the p-side electrode 92 and the n-side electrode 80 cover a minimal area, light absorption by the p-side electrode 92 and the n-side electrode 80 is reduced, which in turn would increase the efficiency of light extraction.

Hereinafter, exemplary embodiments of the present disclosure will be described.

(1) A semiconductor light-emitting device characterized by comprising a plurality of semiconductor layers including a first semiconductor layer having a first conductivity; a second semiconductor layer having a second conductivity, different from the first conductivity and an active layer which is interposed between the first semiconductor layer and the second semiconductor layer and generates light by recombination of electrons and holes; a first inclined face having a first slope inside the plurality of semiconductor layers, which connects an etched-exposed surface of the first semiconductor layer with the surface of the second semiconductor layer and reflects the light from the active layer towards the first semiconductor layer; a second inclined face having a second slope greater than the first slope, which is provided around the plurality of semiconductor layers and reflects the light from the active layer towards the first semiconductor layer; a non-conductive reflective film formed on the second semiconductor layer, for reflecting the light from the active layer towards the first semiconductor layer; a first electrode which provides either electrons or holes to the plurality of semiconductor layers and is electrically connected to the etched-exposed surface of the first semiconductor layer; and a second electrode disposed on the non-conductive reflective film, which provides either electrons if the holes are provided by the first electrode or holes if the electrons are provided by the first electrode and is electrically connected to the second semiconductor layer.

(2) The semiconductor light-emitting device characterized in that the non-conductive reflective film is extended over the first inclined face and the exposed, first semiconductor layer surface (3) The semiconductor light-emitting device characterized in that the non-conductive reflective film comprises a DBR (Distributed Bragg Reflector).

(4) The semiconductor light-emitting device characterized in that the non-conductive reflective film comprises a dielectric film disposed below the DBR.

(5) The semiconductor light-emitting device characterized in that the non-conductive reflective film is formed on the second semiconductor layer only.

(6) The semiconductor light-emitting device characterized in that the non-conductive reflective film comprises a dielectric film.

(7) The semiconductor light-emitting device characterized by comprising an electrical connection that passes through the non-conductive reflective film and connects the second electrode to the second semiconductor layer.

(8) The semiconductor light-emitting device characterized by comprising a finger electrode that is interposed between the non-conductive reflective film and the second semiconductor layer and connected to the second electrode by an electrical connection.

(9) The semiconductor light-emitting device characterized in that the non-conductive reflective film has an inclined face on the edge.

(10) A method of manufacturing a semiconductor light-emitting device, comprising: a step of preparing a plurality of semiconductor layers by using a substrate, the plurality of semiconductor layers including a first semiconductor layer having a first conductivity, a second semiconductor layer having a second conductivity different from the first conductivity, and an active layer which is interposed between the first semiconductor layer and the second semiconductor layer and generates light by recombination of electrons and holes; a first etching step for forming a first inclined face having a first slope within the plurality of semiconductor layers by exposing the surface of the first semiconductor layer using a first mask, the first inclined face connecting the exposed surface of the first semiconductor layer with the surface of the second semiconductor layer and reflecting the light from the active layer towards the first semiconductor layer; a second etching step for forming a second inclined face having a second slope greater than the first slope around the plurality of semiconductor layers using a second mask of a different material from that of the first mask, the second inclined face reflecting the light from the active layer towards the first semiconductor layer; and a step of forming a non-conductive reflective film on the second semiconductor layer for reflecting the light from the active layer towards the first semiconductor layer on the side of the growth substrate.

(11) The method of manufacturing a semiconductor light-emitting device, characterized in that the second mask has a greater etching resistance than that of the first mask.

(12) The method of manufacturing a semiconductor light-emitting device, characterized in that the first mask is made of photoresist materials.

(13) The method of manufacturing a semiconductor light-emitting device, characterized in that the second mask is made of $SiO_2$-base materials.

(14) The method of manufacturing a semiconductor light-emitting device, characterized in that the second etching step is performed prior to the first etching step.

(15) A semiconductor light-emitting device characterized by comprising: a plurality of semiconductor layers growing sequentially on a growth substrate, with the plurality of semiconductor layers including a first semiconductor layer having a first conductivity, a second semiconductor layer having a second conductivity different from the first conductivity, and an active layer which is interposed between the first semiconductor layer and the second semiconductor layer and generates light by recombination of electrons and holes; and a non-conductive reflective film formed on the second semiconductor layer to reflect the light from the active layer towards the first semiconductor layer on the side of the growth substrate, with the non-conductive reflective film having an inclined face formed on the edge.

(16) The semiconductor light-emitting device characterized in that the non-conductive reflective film has two layers having different effective refractive indices.

(17) The semiconductor light-emitting device characterized in that one of the two layers is a DBR.

(18) The semiconductor light-emitting device characterized in that the non-conductive reflective film comprises a DBR, and two layers on either side of the DBR, having an effective refractive index lower than that of the DBR.

(19) The semiconductor light-emitting device characterized by comprising a finger electrode that is interposed between the second semiconductor layer and the non-conductive reflective film and electrically communicates with the second semiconductor layer.

(20) The semiconductor light-emitting device characterized by comprising an electrical connection that passes through the non-conductive reflective film and electrically communicates with the second semiconductor layer.

(21) The semiconductor light-emitting device characterized by comprising an electrical connection that passes through the non-conductive reflective film and electrically communicates with the finger electrode.

(22) The semiconductor light-emitting device characterized by comprising a light absorption barrier formed between the finger electrode and the second semiconductor layer.

(23) The semiconductor light-emitting device characterized in that the inclined face is at an angle between 50 and 70 degrees.

(24) The semiconductor light-emitting device characterized in that the non-conductive reflective film has a thickness in a range from 3 to 8 μm.

(25) The semiconductor light-emitting device characterized in that the DBR is composed of a combination of $SiO_2$ and $TiO_2$, and an underlying layer of the DBR is a dielectric film made of $SiO_2$-base materials and an overlying layer of the DBR is a clad layer made of $SiO_2$-base materials.

(26) The semiconductor light-emitting device characterized by comprising a finger electrode that is interposed between the second semiconductor layer and the non-conductive reflective film and electrically communicates with the second semiconductor layer; and an electrical connection that passes through the non-conductive reflective film and electrically communicates with the finger electrode.

(27) A semiconductor light-emitting device characterized by comprising: a plurality of semiconductor layers growing sequentially on a growth substrate, with the plurality of semiconductor layers including a first semiconductor layer having a first conductivity, a second semiconductor layer having a second conductivity different from the first conductivity, and an active layer which is interposed between the first semiconductor layer and the second semiconductor layer and generates light by recombination of electrons and holes, wherein the plurality of semiconductor layers has a first side, a third side opposite to the first side, a second side, and a fourth side opposite to the second side, respectively; a contact area where the first semiconductor layer is exposed by a partial removal of the second semiconductor layer and the active layer; a non-conductive reflective film formed to cover the second semiconductor layer and the contact area in order to reflect the light from the active layer towards to the first semiconductor layer on the side of the growth substrate; a first finger electrode between the non-conductive reflective film and the second semiconductor layer, the first finger electrode extending lengthways from the first side to the third side; a first electrical connection that passes through the non-conductive reflective film from the first side and electrically communicates with the first finger electrode; a second electrical connection that passes through the non-conductive reflective film from the third side and electrically communicates with the first semiconductor layer in the contact area; two first bonding pads in electrical communication with the first electrical connection; two second bonding pads in electrical communication with the second electrical connection; a first electrode in electrical communication with the first electrical connection, with the first electrode including two first pad seats where two first bonding pads are placed respectively, and a joint for connecting the two first pad seats; and a second electrode in electrical communication with the second electrical connection, with the second electrode including two second pad seats where two second bonding pads are placed respectively, and a joint for connecting the two second pad seats.

(28) The semiconductor light-emitting device characterized in that the first pad seats are formed more broadly than the first bonding pads, the joint for connecting the first pad seats is formed more narrowly than the first bonding pads, the second pad seats are formed more broadly than the second bonding pads, and the joint for connecting the second pad seats is formed more narrowly than the second bonding pads.

(29) The semiconductor light-emitting device characterized in that the first and second bonding pads are formed where the first and second boding pads are not overlapped with the first finger electrode.

(30) The semiconductor light-emitting device characterized in that a part of the joint of the first electrode and the joint of the second electrode, which is in communication with the first or second electrical connection is formed more broadly, while the remaining part of the joint of the first electrode and the joint of the second electrode is formed more narrowly.

(31) The semiconductor light-emitting device characterized in that the first bonding pad and the second bonding pad have the same height.

(32) The semiconductor light-emitting device characterized in that the first bonding pad and the second bonding pad are formed to be taller than a most protruded portion of the first electrode, by 1 to 3 μm.

(33) The semiconductor light-emitting device characterized in that the first and second bonding pads comprise a eutectic bonding layer, respectively.

(34) The semiconductor light-emitting device characterized in that the first and second bonding pads comprise an underlying spacer layer and a bonded layer overlying the spacer layer, respectively.

(35) The semiconductor light-emitting device characterized in that the bonding layer is a eutectic bonding layer.

(36) The semiconductor light-emitting device characterized in that the spacer layer is a metal layer.

(37) The semiconductor light-emitting device characterized by comprising a second finger electrode between the first semiconductor layer and the non-conductive reflective film in the contact area, the second finger electrode extending lengthways from the third side to the first side and electrically communicating with the second electrode by the second electrical connection that passes through the non-conductive reflective film.

(38) The semiconductor light-emitting device characterized in that the first and second bonding pads are formed where the first and second boding pads are not overlapped with the first and second finger electrodes.

In a semiconductor light-emitting device according to the present disclosure, an excellent efficiency of light extraction can be obtained.

In another semiconductor light-emitting device according to the present disclosure, a greater amount of light can be forwarded to the n-type semiconductor.

In a method for manufacturing a semiconductor light-emitting device according to the present disclosure, a light-emitting area can be increased.

In yet another semiconductor light-emitting device according to the present disclosure, the efficiency of light extraction can be improved.

In yet another semiconductor light-emitting device according to the present disclosure, a new form of a reflective film structure can be embodied.

In yet another semiconductor light-emitting device according to the present disclosure, a new form of a flip-chip can be embodied.

In yet another semiconductor light-emitting device according to the present disclosure, a reflective film structure that incorporates finger electrodes can be embodied.

In yet another semiconductor light-emitting device according to the present disclosure, a flip-chip that incorporates finger electrodes can be embodied.

In yet another semiconductor light-emitting device according to the present disclosure, during a bonding operation on the mount part, the semiconductor light-emitting device can be balanced without sloping.

In yet another semiconductor light-emitting device according to the present disclosure, the efficiency of light extraction can be improved.

In yet another semiconductor light-emitting device according to the present disclosure, a new form of a reflective film structure can be embodied.

In yet another semiconductor light-emitting device according to the present disclosure, a new form of a flip-chip can be embodied.

In yet another semiconductor light-emitting device according to the present disclosure, a reflective film structure that incorporates finger electrodes can be embodied.

In yet another semiconductor light-emitting device according to the present disclosure, a flip-chip that incorporates finger electrodes can be embodied.

In yet another semiconductor light-emitting device according to the present disclosure, it is possible to provide sufficient heat dissipation effects, while reducing light absorption.

In yet another semiconductor light-emitting device according to the present disclosure, the material cost can be lowered.

What is claimed is:

1. A semiconductor light-emitting device comprising:
    a plurality of semiconductor layers including a first semiconductor layer having a first conductivity, a second semiconductor layer having a second conductivity different from the first conductivity, and an active layer which is interposed between the first semiconductor layer and the second semiconductor layer and generates light by recombination of electrons and holes;
    a first inclined face having a first slope inside the plurality of semiconductor layers, which connects an exposed surface of the first semiconductor layer with a surface of the second semiconductor layer and reflects the light from the active layer towards the first semiconductor layer;
    a second inclined face having a second slope greater than the first slope, which is provided around the plurality of semiconductor layers and reflects the light from the active layer towards the first semiconductor layer;
    a non-conductive reflective film formed over the second semiconductor layer, for reflecting the light from the active layer towards the first semiconductor layer;
    a first electrode which provides one of electrons and holes to the plurality of semiconductor layers and is electrically connected to the exposed surface of the first semiconductor layer; and
    a second electrode disposed on the non-conductive reflective film, which provides the other of electrons and holes to the plurality of semiconductor layers and is electrically connected to the second semiconductor layer,
    wherein the light is reflected from the active layer towards the first semiconductor layer by the non-conductive reflective film formed over the second semiconductor layer.

2. The semiconductor light-emitting device according to claim 1, wherein the non-conductive reflective film is extended over the first inclined face and the exposed, first semiconductor layer surface.

3. The semiconductor light-emitting device according to claim 1, wherein the non-conductive reflective film comprises a DBR (Distributed Bragg Reflector).

4. The semiconductor light-emitting device according to claim 3, wherein the non-conductive reflective film comprises a dielectric film disposed below the DBR.

5. The semiconductor light-emitting device according to claim 1, wherein the non-conductive reflective film is formed on the second semiconductor layer only.

6. The semiconductor light-emitting device according to claim 1, wherein the non-conductive reflective film comprises a dielectric film.

7. The semiconductor light-emitting device according to claim 1, comprising an electrical connection that passes through the non-conductive reflective film and connects the second electrode to the second semiconductor layer.

8. The semiconductor light-emitting device according to claim 7, comprising a finger electrode that is interposed between the non-conductive reflective film and the second semiconductor layer and connected to the second electrode by an electrical connection.

9. The semiconductor light-emitting device according to claim 1, wherein the non-conductive reflective film has an inclined face on an edge of the non-conductive reflective film.

* * * * *